(12) United States Patent
Emoto

(10) Patent No.: US 10,510,528 B2
(45) Date of Patent: Dec. 17, 2019

(54) SUBSTRATE PROCESSING METHOD

(71) Applicant: SCREEN Holdings Co., Ltd., Kyoto (JP)

(72) Inventor: Tetsuya Emoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 605 days.

(21) Appl. No.: 15/180,631

(22) Filed: Jun. 13, 2016

(65) Prior Publication Data

US 2016/0372320 A1 Dec. 22, 2016

(30) Foreign Application Priority Data

Jun. 16, 2015 (JP) ................. 2015-121150

(51) Int. Cl.
| | | |
|---|---|---|
| *H01L 21/02* | (2006.01) | |
| *H01L 21/67* | (2006.01) | |
| *B08B 3/10* | (2006.01) | |
| *H01L 21/687* | (2006.01) | |
| *C11D 11/00* | (2006.01) | |

(52) U.S. Cl.
CPC ......... *H01L 21/02057* (2013.01); *B08B 3/10* (2013.01); *H01L 21/67028* (2013.01); *H01L 21/67051* (2013.01); *H01L 21/67103* (2013.01); *H01L 21/68728* (2013.01); *C11D 11/0047* (2013.01)

(58) Field of Classification Search
None
See application file for complete search history.

(56) References Cited

U.S. PATENT DOCUMENTS

| | | | |
|---|---|---|---|
| 5,882,433 A | 3/1999 | Ueno | 134/31 |
| 2003/0178047 A1 | 9/2003 | Hirae | 134/26 |
| 2007/0295365 A1 | 12/2007 | Miya et al. | 134/26 |
| 2010/0101497 A1 | 4/2010 | Izuta et al. | 118/730 |
| 2012/0298149 A1* | 11/2012 | Puggl | H01L 21/67034 134/33 |
| 2013/0333722 A1 | 12/2013 | Tanaka | 134/1 |
| 2014/0065295 A1 | 3/2014 | Emoto et al. | 427/8 |
| 2014/0127908 A1* | 5/2014 | Okutani | H01L 21/02068 438/694 |

(Continued)

FOREIGN PATENT DOCUMENTS

| | | |
|---|---|---|
| JP | 9-38595 | 2/1997 |
| JP | 2003-275696 A | 9/2003 |

(Continued)

*Primary Examiner* — Mikhail Kornakov
*Assistant Examiner* — Ryan L. Coleman
(74) *Attorney, Agent, or Firm* — Ostrolenk Faber LLP

(57) ABSTRACT

A substrate processing method includes a replacement step of replacing a rinse liquid adhered to the front surface of a substrate with a low surface tension liquid whose surface tension is lower than that of the rinse liquid, where the replacement step includes a low surface tension liquid supply step of supplying the low surface tension liquid to the front surface while supplying a heating fluid to the rear surface on a side opposite to the front surface and a post-heating step of supplying the heating fluid to the rear surface on the side opposite to the front surface of the substrate, in a state in which the supply of the low surface tension liquid to the front surface is stopped, before the start of a spin dry step after the completion of the low surface tension liquid supply step.

4 Claims, 14 Drawing Sheets

(56) References Cited

U.S. PATENT DOCUMENTS

| | | | |
|---|---|---|---|
| 2014/0273498 A1 | 9/2014 | Kobayashi et al. | 438/745 |
| 2015/0093905 A1 | 4/2015 | Fujiwara et al. | 438/745 |

FOREIGN PATENT DOCUMENTS

| | | |
|---|---|---|
| JP | 2007-227764 A | 9/2007 |
| JP | 2007-227765 A | 9/2007 |
| JP | 2008-34779 A | 2/2008 |
| JP | 2009-212301 | 9/2009 |
| JP | 2010-050143 A | 3/2010 |
| JP | 2010-238758 | 10/2010 |
| JP | 2012-054373 A | 3/2012 |
| JP | 2014-17466 A | 1/2014 |
| JP | 2014-179489 A | 9/2014 |
| JP | 2014-197571 A | 10/2014 |
| KR | 10-2015-0035388 | 4/2015 |

* cited by examiner

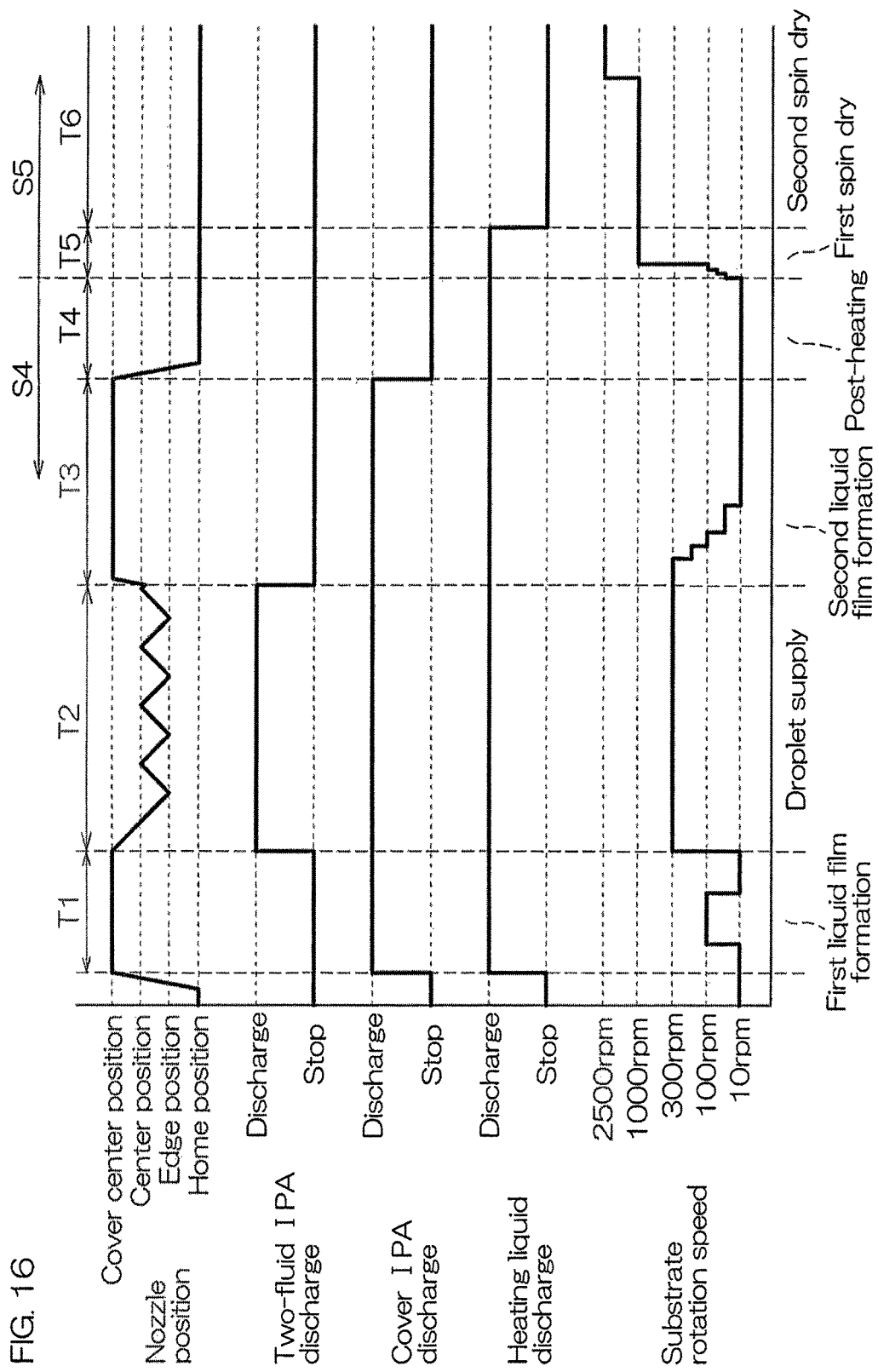

SUBSTRATE PROCESSING METHOD

BACKGROUND OF THE INVENTION

1. Field of the Invention

The present invention relates to a substrate processing method of processing a substrate with a low surface tension liquid. Examples of the substrate to be processed include substrates such as semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photomasks, ceramic substrates and substrates for solar cell.

2. Description of Related Art

In the manufacturing processes of semiconductor devices, processing using a processing liquid is performed on a front surface of substrates such as semiconductor wafer. A single substrate processing type substrate processing apparatus that processes a single at a time substrate includes a spin chuck that rotates the substrate while holding the substrate substantially horizontally and a nozzle that supplies the processing liquid to the front surface of the substrate rotated by the spin chuck.

In a typical substrate processing step, a chemical liquid is supplied to the substrate held by the spin chuck. Thereafter, a rinse liquid is supplied to the substrate, and thus the chemical liquid on the substrate is replaced with the rinse liquid. Then, a spin dry step that removes the rinse liquid on the substrate is performed. In the spin dry step, the substrate is rotated at a high speed, and thus the rinse liquid adhered to the substrate is removed (dried) by being spun off. In general, the rinse liquid is deionized water.

When a fine pattern is formed on the front surface of the substrate, in the spin dry step, the rinse liquid entering the pattern may not be removed, and thus a drying failure may occur. Hence, a method is proposed in which an organic solvent such as isopropyl alcohol (IPA) is supplied to the front surface of the substrate after being processed with the rinse liquid, in which the rinse liquid entering the gap of the pattern on the front surface of the substrate is replaced with the organic solvent and in which the front surface of the substrate is dried.

As shown in FIG. 17, in the spin dry step in which the substrate is dried by rotating the substrate at a high speed, a liquid surface (interface between air and the liquid) is formed within the pattern. In this case, the surface tension of the liquid is exerted on the contact position of the liquid surface and the pattern. The surface tension is one of the causes that collapse the pattern.

As disclosed in Japanese Patent Application Publication No. 2009-212301, when after rinse processing, the liquid of an organic solvent is supplied to the front surface of the substrate before a spin dry step, the liquid of the organic solvent enters a pattern. The surface tension of the organic solvent is lower than that of water such as a typical rinse liquid. Hence, the problem in which the pattern is collapsed by the surface tension is alleviated.

In the method disclosed in Japanese Patent Application Publication No. 2009-212301, in order to enhance the replaceability of the rinse liquid with the organic solvent, not only is the organic solvent supplied to the front surface of the substrate but also a heating liquid is supplied to the rear surface on the Side opposite to the front surface of the substrate.

In the method disclosed in Japanese Patent Application Publication No. 2009-212301, in a state in which the supply of the heating liquid to the rear surface of the substrate is stopped, the supply of the organic solvent to the front surface of the substrate is continued for a predetermined period of time. During the period of time, the supply of the organic solvent to the substrate is continued, and the heat of the substrate is removed by the organic solvent which is additionally supplied. Hence, a significant heat loss occurs in the substrate. Furthermore, the heating of the substrate by the heating liquid is stopped. Thus, the temperature of the substrate is gradually lowered. Thereafter, the spin dry step is started. Hence, in the present method, the spin dry step is started on the substrate whose temperature is lowered. Although in the spin dry step, a low surface tension liquid entering the pattern on the front surface of the substrate needs to be spun off by centrifugal force resulting from the rotation of the substrate, when the spin dry step is started in a state in which the substrate has a low temperature, it takes a long period of time to perform the spin dry step. When it takes a long period of time to perform the spin dry step, the impulse of the surface tension of the low surface tension liquid acting on the pattern is increased, with the result that this contributes to the collapse of the pattern.

Hence, an object of the present invention is to provide a substrate processing method that can effectively reduce the collapse of a pattern.

According to the invention, there is provided a substrate processing apparatus including a replacement step of replacing a rinse liquid adhered to a front surface of a substrate with a low surface tension liquid whose surface tension is lower than a surface tension of the rinse liquid and a spin dry step of rotating, after completion of the replacement step, the substrate about a predetermined rotation axis to spin off the low surface tension liquid so as to dry the front surface, where the replacement step includes a low surface tension liquid supply step of supplying the low surface tension liquid to the front surface while supplying a heating fluid to a rear surface on a side opposite to the front surface and a post-heating step of supplying the heating fluid to the rear surface on the side opposite to the front surface of the substrate, in a state in which the supply of the low surface tension liquid to the front surface is stopped, before start of the spin dry step after completion of the low surface tension liquid supply step.

According to the method, in the post-heating step after the low surface tension liquid supply step, the supply of the low surface tension liquid to the front surface of the substrate is stopped, and thus the heat of the substrate is prevented from being removed by the low surface tension liquid supplied additionally. In this state, the heating liquid is supplied to the lower surface of the substrate to heat the substrate. In this way, it is possible to start the spin dry step on the substrate at a high temperature. Hence, the spin dry step can be completed in a short period of time. If the spin dry step can be completed in a short period of time, it is possible to restrict the impulse of the surface tension acting on the pattern at a small level. In this way, it is possible to more effectively reduce the collapse of the pattern at the time of the spin dry step.

The heating fluid may be a liquid (heating liquid) or a gas (heating gas). An example of the heating liquid is water. An example of the heating gas is an inert gas and water vapor. The heating fluid may be supplied to the entire rear surface or may be supplied to part of the rear surface.

In a preferred embodiment of the invention, the post-heating step and the spin dry step are continuously performed.

According to the method, the temperature of the substrate at the start of the spin dry step can be further increased. Hence, it is possible to complete the spin dry step in a shorter period of time.

In the spin dry step, the heating fluid may be supplied to the rear surface of the substrate.

According to the method, the temperature of the substrate when performing the spin dry step can be further increased. Hence, it is possible to complete the spin dry step in a shorter period of time.

The substrate processing method may further include a paddle step of bringing the substrate into a stationary state or rotating the substrate about the rotation axis at a paddle speed in parallel with the post-heating step.

According to the method, in the paddle step, on the upper surface of the substrate, the liquid film of the low surface tension liquid covering the upper surface is supported so as to be formed in the shape of a paddle. Hence, before the start of the spin dry step, the front surface of the substrate can be prevented from being exposed from the liquid film. When the front surface of the substrate is partially exposed, the cleanliness of the substrate may be lowered by particle generation, and the uniformity of the processing may be lowered. However, the front surface of the substrate can be prevented from being exposed from the liquid film, and thus it is possible to prevent the lowering of the cleanliness of the substrate and the lowering of the uniformity of the processing.

The post-heating step may include a step of discharging the heating fluid simultaneously to the rear surface from a plurality of heating fluid discharge ports aligned along a radial direction of the rotation of the substrate.

According to the method, the heating fluid is discharged to the rear surface of the substrate from a plurality of heating fluid discharge ports aligned along the radial direction of the rotation of the substrate. In parallel with discharging the heating fluid from the heating fluid discharge ports, the substrate is rotated, and thus it is possible to supply the heating fluid to the entire rear surface of the substrate. Hence, in the post-heating step, the liquid film of the low surface tension liquid can be heated in the entire front surface of the substrate. In this way, it is possible to effectively reduce the collapse of the pattern in the entire front surface of the substrate.

The post-heating step may include a step of discharging the heating fluid to the rear surface in a direction intersecting the radial direction of the rotation of the substrate when seen in a direction perpendicularly intersecting the rotation axis.

According to the method, the heating fluid discharged to the lower surface of the substrate is unlikely to flow around onto the upper surface of the substrate.

The heating fluid may include a heating liquid, and the flow rate of the heating liquid in the post-heating step may be set such that the heating fluid supplied to the rear surface of the substrate is prevented from flowing around onto the front surface.

According to the method, the flow rate of the heating liquid supplied to the rear surface of the substrate is set such that the heating fluid is prevented from flowing around onto the front surface of the substrate. Hence, even when in the post-heating step, the supply of the low surface tension liquid to the front surface of the substrate is stopped, it is possible to heat the liquid film of the low surface tension liquid while reliably preventing the low surface tension liquid from flowing around onto the front surface of the substrate at a high temperature.

The low surface tension liquid supply step may include a step of discharging the low surface tension liquid from a low surface tension liquid nozzle which is located above the front surface of the substrate, the spin dry step may be performed in a state in which an opposite member is opposite above the front surface of the substrate and in parallel with the post-heating step, the low surface tension liquid nozzle may be retracted from above the substrate, and the opposite member may be located above the substrate.

According to the method, in parallel with the post-heating step, the low surface tension liquid nozzle is retracted from above the substrate, and the opposite member is located above the substrate. Since even in the period of the retraction and the arrangement, the supply of the heating fluid to the rear surface of the substrate is continued, it is possible to heat the liquid film of the low surface tension liquid until immediately before the start of the spin dry step.

The low surface tension liquid supply step may include a droplet supply step of supplying a droplet of an organic solvent produced by mixing the organic solvent with a gas to at least an outer circumferential portion of the front surface.

According to the method, the droplet of the low surface tension liquid is supplied to at least the outer circumferential portion of the front surface of the substrate. A physical force is applied by the collision of the droplets of the organic solvent to the supply region of the droplets of the organic solvent on the front surface of the substrate. Thus, it is possible to further enhance the performance of the replacement with the low surface tension liquid.

In general, the performance of the replacement with the organic solvent in the outer circumferential portion of the front surface of the substrate is considered to be low. However, the droplets of the low surface tension liquid are supplied to at least the outer circumferential portion of the front surface, and thus it is possible to improve the performance of the replacement with the organic solvent in the outer circumferential portion of the front surface of the substrate.

The droplet supply step may include a droplet discharge step of discharging the droplet of the organic solvent from a two-fluid nozzle to a discharge region within the front surface and a discharge region movement step of moving the discharge region between a center portion of the front surface and a circumferential edge portion of the front surface in parallel with the droplet discharge step.

According to the method, it is possible to enhance the performance of the replacement with the low surface tension liquid in the entire front surface of the substrate.

The low surface tension liquid supply step may include a first liquid film formation step which is performed before the droplet discharge step and which supplies the organic solvent to the front surface so as to form a liquid film of the organic solvent covering the entire front surface.

According to the method, before the supply of the droplets to the front surface of the substrate from the two-fluid nozzle, the liquid film of the low surface tension liquid covering the entire front surface of the substrate is formed. Hence, the droplets of the low surface tension liquid discharged from the two-fluid nozzle collide with the liquid film of the organic solvent. Thus, it is possible to prevent the droplets of the low surface tension liquid from directly colliding with the front surface of the substrate in a dry state, with the result that it is possible to reduce particle generation.

The low surface tension liquid supply step may include a second liquid film formation step which is performed after the droplet discharge step and which supplies the organic solvent to the front surface so as to form a liquid film of the organic solvent covering the entire front surface.

According to the method, after the droplet discharge step, the liquid film of the low surface tension liquid covering the front surface is held on the front surface of the substrate. Hence, before the start of the spin dry step, the front surface of the substrate can be prevented from being exposed from the liquid film. When the front surface of the substrate is partially exposed, the cleanliness of the substrate may be lowered by particle generation, and the uniformity of the processing may be lowered. However, the front surface of the substrate can be prevented from being exposed from the liquid film, and thus it is possible to prevent the lowering of the cleanliness of the substrate and the lowering of the uniformity of the processing.

The spin dry step may be performed while an atmosphere around the front surface is maintained to be an atmosphere of nitrogen.

According to the method, since the front surface can be dried while the atmosphere around the front surface of the substrate is maintained to be the atmosphere of nitrogen, it is possible to reduce or prevent watermark generation after the drying.

The objects, the features and the effects in the present invention described above or still other objects, features and effects will be more apparent from the following description of preferred embodiments with reference to the accompanying drawings.

BRIEF DESCRIPTION OF THE DRAWINGS

FIG. 16 is a time chart for illustrating the replacement step and the spin dry step.

DETAILED DESCRIPTION OF PREFERRED EMBODIMENTS

Figure 1:
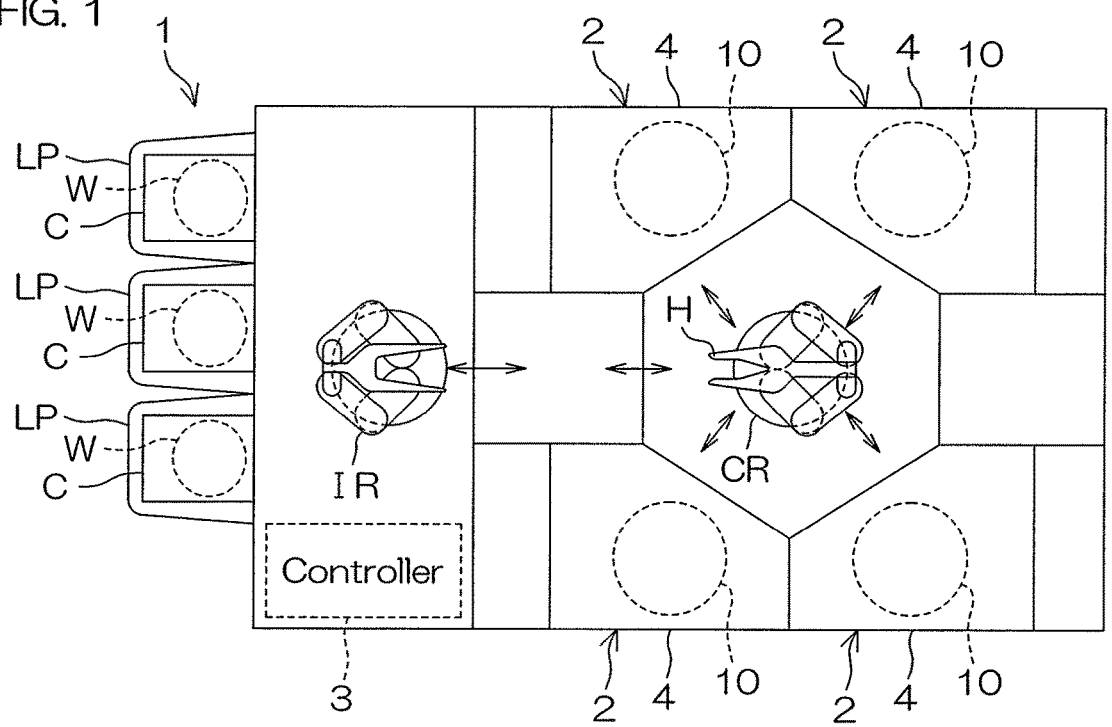
FIG. 1 is a schematic plan view for illustrating the internal layout of a substrate processing apparatus for performing a substrate processing method according to a first preferred embodiment of the present invention.

FIG. 1 is a schematic plan view for illustrating the internal layout of a substrate processing apparatus 1 for performing a substrate processing method according to a first preferred embodiment of the present invention. The substrate processing apparatus 1 is a single substrate processing type device that processes disc-shaped substrates W such as a semiconductor wafer one by one with a processing liquid or a processing gas. The substrate processing apparatus 1 includes a plurality of processing units 2 which use the processing liquid to process the substrates W, load ports LP on which carriers C storing a plurality of substrates W to be processed in the processing units 2 are placed, transfer robots IR and CR which transfer the substrates W between the load ports LP and the processing units 2 and a controller 3 which controls the substrate processing apparatus 1. The transfer robot IR transfers the substrates W between the carriers C and the transfer robot CR. The transfer robot CR transfers the substrates W between the transfer robot IR and the processing units 2. For example, the plurality of processing units 2 have the same configuration.

Figure 2:
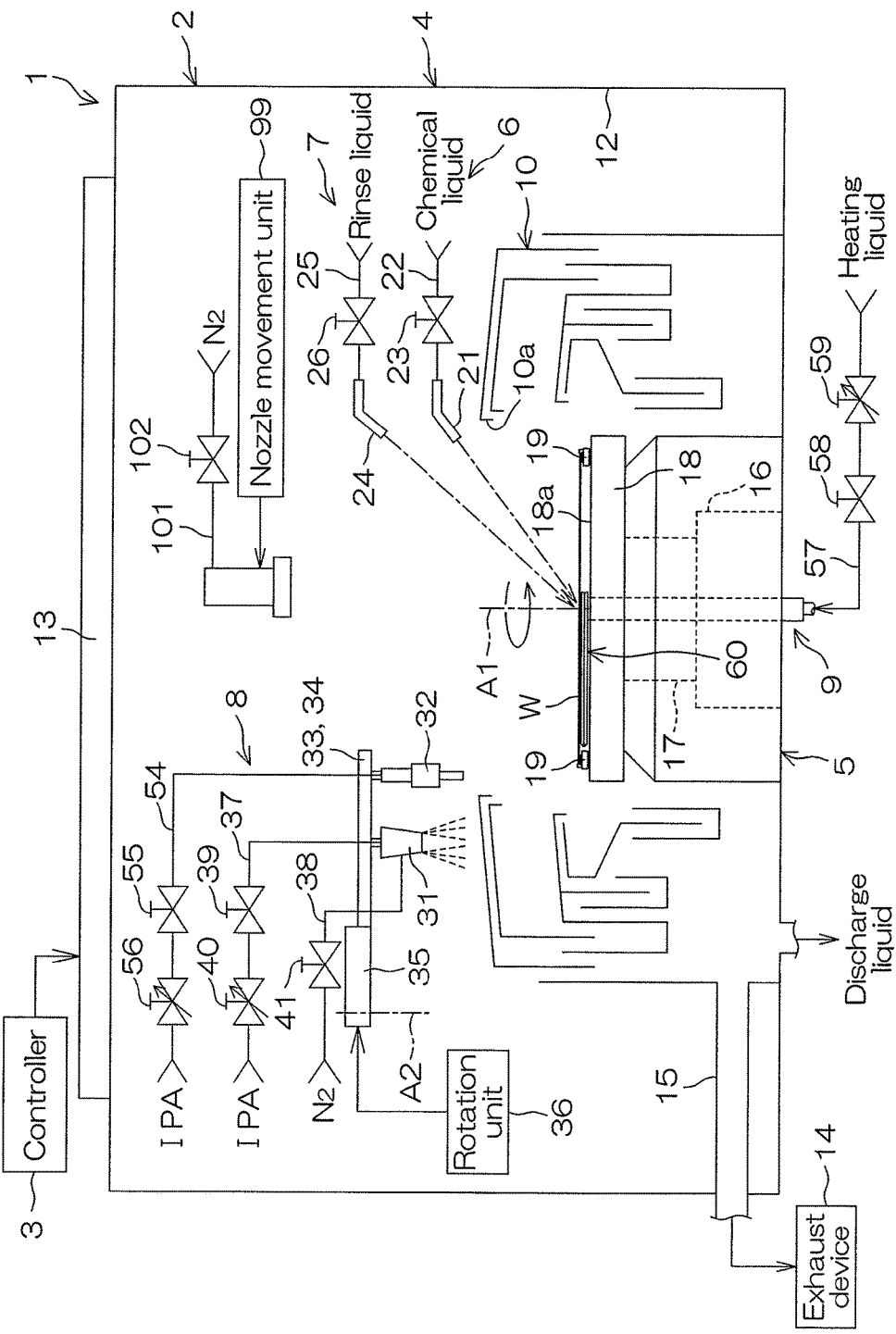
FIG. 2 is a schematic cross-sectional view for illustrating an example of the configuration of a processing unit included in the substrate processing apparatus.
Figure 3:
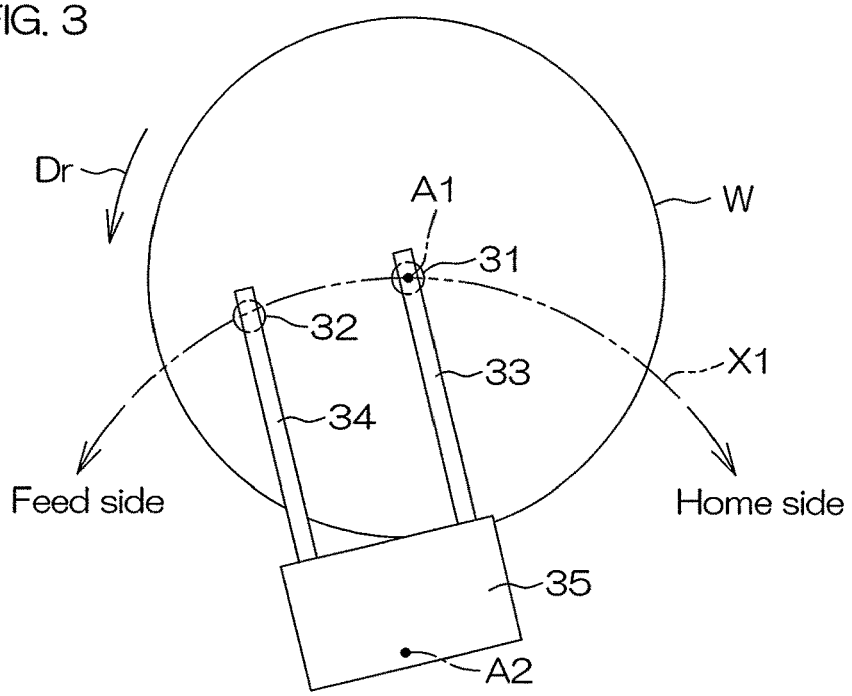
FIG. 3 is a schematic plan view for illustrating the positions of first and second organic solvent nozzles.
Figure 4:
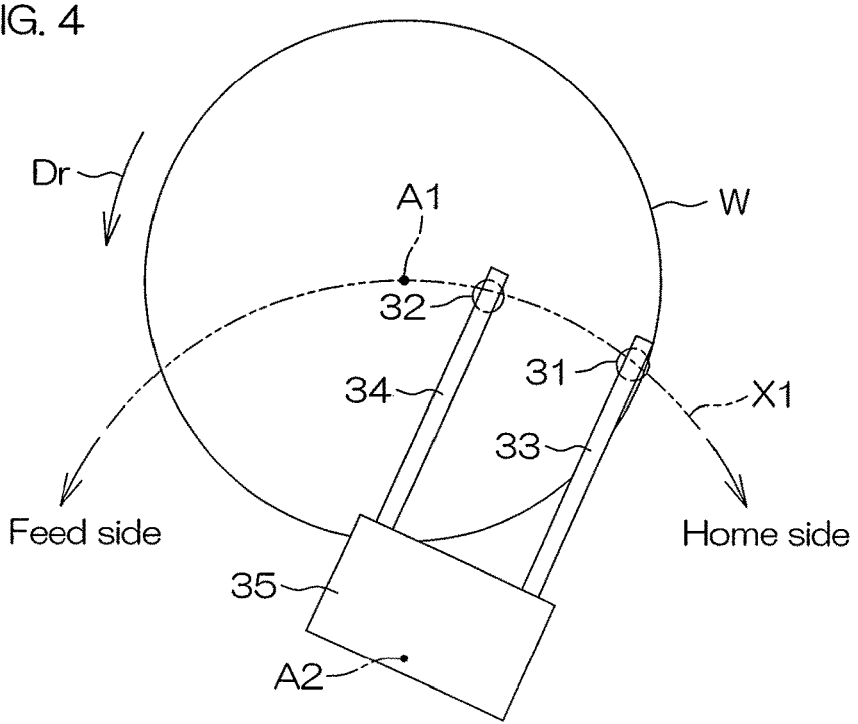
FIG. 4 is a schematic plan view for illustrating the positions of the first and second organic solvent nozzles.
Figure 5:
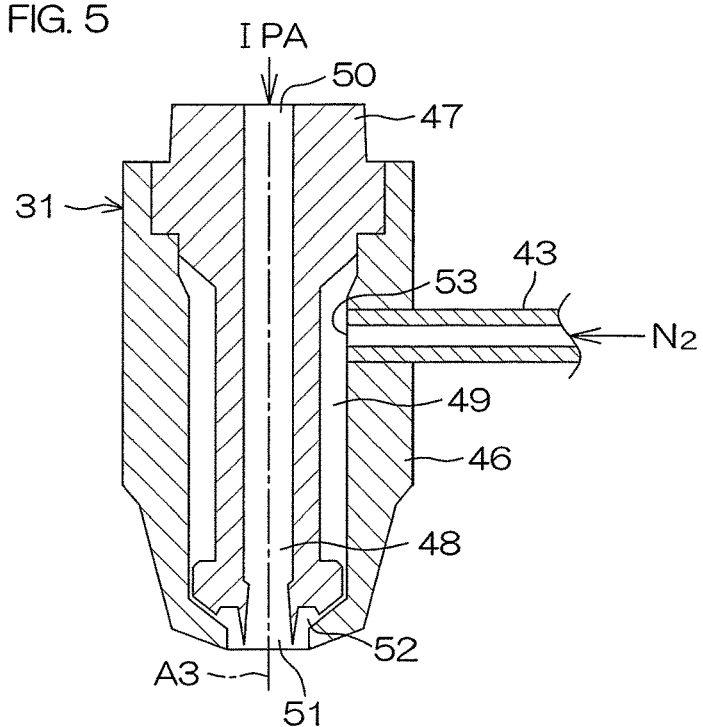
FIG. 5 is a schematic cross-sectional view for illustrating the configuration of the first organic solvent nozzle included in the substrate processing apparatus.

FIG. 2 is a schematic cross-sectional view for illustrating an example of the configuration of the processing unit 2. FIGS. 3 and 4 are schematic plan views for illustrating the positions of first and second organic solvent nozzles 31 and 32. FIG. 5 is a schematic cross-sectional view for illustrating the configuration of the first organic solvent nozzle 31.

The processing unit 2 includes a box-shaped processing chamber 4 which has an internal space, a spin chuck (substrate holding unit) 5 which holds one substrate W in a horizontal position within the processing chamber 4 and which rotates the substrate W about a vertical rotation axis A1 passing through the center of the substrate W, a chemical liquid supply unit 6 which supplies a chemical liquid to the upper surface of the substrate W held by the spin chuck 5, a rinse liquid supply unit 7 which supplies a rinse liquid to the upper surface of the substrate W held by the spin chuck 5, an organic solvent supply unit (low surface tension liquid supply unit) 8 which supplies IPA serving as an example of an organic solvent (low surface tension liquid) to the upper surface (the front surface of the substrate W) of the substrate W held by the spin chuck 5, a lower surface supply unit (heating fluid supply unit) 9 which supplies hot water serving as an example of a heating liquid that is a heating fluid to the lower surface (the rear surface of the substrate W) of the substrate W held by the spin chuck 5 and a cylindrical processing cup 10 which surrounds the spin chuck 5.

The processing chamber 4 includes a box-shaped partition wall 12, a FFU (fan filter unit) 13 which serves as a blower unit that blows clean air from an upper portion of the partition wall 12 into the partition wall 12 (which corresponds to the interior of the processing chamber 4) and an exhaust device 14 which discharges a gas within the processing chamber 4 from a lower portion of the partition wall 12.

The FFU 13 is arranged above the partition wall 12 and is attached to the ceiling of the partition wall 12. The FFU 13 blows the clean air into the processing chamber 4 from the ceiling of the partition wall 12. The exhaust device 14 is connected via a discharge duct 15 connected to the interior of the processing cup 10 to the bottom portion of the processing cup 10, and sucks the interior of the processing cup 10 from the bottom portion of the processing cup 10. A downflow (downward flow) is formed within the processing chamber 4 by the FFU 13 and the exhaust device 14.

As the spin chuck 5, a sandwich type chuck is adopted that sandwiches the substrate W in a horizontal direction to hold the substrate W horizontally. Specifically, the spin chuck 5 includes a spin motor 16, a spin shaft 17 which is integral with the drive shaft of the spin motor 16 and a disc-shaped spin base 18 which is attached to the upper end of the spin shaft 17 substantially horizontally.

The spin base 18 includes a horizontal, circular upper surface 18a which has an outside diameter larger than that of the substrate W. In the circumferential edge portion of the upper surface 18a, a plurality of (three or more, for example, four) clamping members 19 (also see FIG. 6) are arranged. In the circumferential edge portion of the upper surface of the spin base 18, the plurality of clamping members 19 are spaced an appropriate distance apart, for example, equal distance, on the circumference corresponding to the outer circumferential shape of the substrate W.

The chemical liquid supply unit 6 includes a chemical liquid nozzle 21. The chemical liquid nozzle 21 is, for example, a straight nozzle which discharges the solution in a continuous flow state, and is fixedly arranged above the spin chuck 5 with its discharge port directed to the center portion of the upper surface of the substrate W. A chemical liquid pipe 22 in which the chemical liquid from a chemical liquid supply source is supplied is connected to the chemical liquid nozzle 21. In a middle of the chemical liquid pipe 22, a chemical liquid valve 23 which switches the supply/supply stop of the chemical liquid from the chemical liquid nozzle 21 is interposed. When the chemical liquid valve 23 is opened, the chemical liquid of the continuous flow supplied from the chemical liquid pipe 22 to the chemical liquid nozzle 21 is discharged from the discharge port set at the lower end of the chemical liquid nozzle 21. When the chemical liquid valve 23 is closed, the supply of the chemical liquid from the chemical liquid pipe 22 to the chemical liquid nozzle 21 is stopped.

Specific examples of the chemical liquid include an etching solution and a washing solution. Further specific examples of the chemical liquid may include hydrofluoric acid, SC1 (ammonia hydrogen peroxide mixture), SC2 (hydrochloric acid hydrogen peroxide mixture), ammonium fluoride and buffered hydrofluoric acid (mixture of hydrofluoric acid and ammonium fluoride).

The rinse liquid supply unit 7 includes a rinse liquid nozzle 24. The rinse liquid nozzle 24 is, for example, a straight nozzle which discharges the liquid in a continuous flow state, and is fixedly arranged above the spin chuck 5 with its discharge port directed to the center portion of the upper surface of the substrate W. A rinse liquid pipe 25 in which the rinse liquid from a rinse liquid supply source is supplied is connected to the rinse liquid nozzle 24. In a middle portion of the rinse liquid pipe 25, a rinse liquid valve 26 which switches the supply/supply stop of the rinse liquid from the rinse liquid nozzle 24 is interposed. When the rinse liquid valve 26 is opened, the rinse liquid of the continuous flow supplied from the rinse liquid pipe 25 to the rinse liquid nozzle 24 is discharged from the discharge port set at the lower end of the rinse liquid nozzle 24. When the rinse liquid valve 26 is closed, the supply of the rinse liquid from the rinse liquid pipe 25 to the rinse liquid nozzle 24 is stopped. Although the rinse liquid is, for example, deionized water (DIW), the rinse liquid is not limited to deionized water, and may be any one of carbonated water, electrolytic ion water, hydrogen water, ozone water and hydrochloric acid water of a dilute concentration (for example, about 10 to 100 ppm).

Each of the chemical liquid nozzle 21 and the rinse liquid nozzle 24 does not need to be fixedly arranged for the spin chuck 5. For example, a so-called scan nozzle form may be adopted in which they are attached to an arm capable of swinging within a horizontal plane above the spin chuck 5 and the liquid landing position of the processing liquid (the chemical liquid, the rinse liquid or the organic solvent) on the upper surface of the substrate W is scanned by the swinging of the arm.

The organic solvent supply unit 8 includes a first organic solvent nozzle 31 which supplies droplets of the organic solvent to the upper surface of the substrate W held by the spin chuck 5, a second organic solvent nozzle 32 which supplies the continuous flow of the organic solvent to the upper surface of the substrate W held by the spin chuck 5, a first nozzle holder 33 which holds the first organic solvent nozzle 31, a second nozzle holder 34 which holds the second organic solvent nozzle 32, a nozzle arm 35 which is extended in a horizontal direction and in which the first and second nozzle holders 33 and 34 are attached to a tip end portion and a rotation unit 36 which is connected to the nozzle arm 35.

As shown in FIGS. 3 and 4, the first nozzle holder 33 is a member which is linearly extended along the nozzle arm 35 and which is formed substantially in the shape of a bar. The first organic solvent nozzle 31 is attached to the first nozzle holder 33.

As shown in FIGS. 3 and 4, the second nozzle holder 34 is a member which is linearly extended along the nozzle arm 35 and which is formed substantially in the shape of a bar. The second organic solvent nozzle 32 is attached to the second nozzle holder 34. The first and second organic solvent nozzles 31 and 32 are arranged substantially at the same height.

The first and second organic solvent nozzles 31 and 32 are rotated about a rotation axis A2 together with the nozzle arm 35. In this way, the first and second organic solvent nozzles 31 and 32 are moved in the horizontal direction.

The rotation unit 36 moves the first and second organic solvent nozzles 31 and 32 horizontally within a horizontal plane including an area above the spin chuck 5. As shown in FIGS. 3 and 4, the rotation unit 36 moves the first and second organic solvent nozzles 31 and 32 horizontally along an arc-shaped locus X1 extended along the upper surface of the substrate W held by the spin chuck 5 while maintaining a positional relationship constant between the nozzles. The first and second organic solvent nozzles 31 and 32 are horizontally moved between a center position (the positions of the first and second organic solvent nozzles 31 and 32 shown in FIG. 3) in which the first organic solvent nozzle 31 is arranged above the center portion of the upper surface of the substrate W and an edge position (the positions of the first and second organic solvent nozzles 31 and 32 shown in FIG. 4) in which the first organic solvent nozzle 31 is arranged above the circumferential edge portion of the upper surface of the substrate W. When the substrate W is a circular substrate having a diameter of 300 mm, the center portion is a position in which in plan view, the discharge port of the first organic solvent nozzle 31 is 9 mm away from the rotation axis A1 of the substrate W to a home side and in which the discharge port of the second organic solvent nozzle 32 is 91 mm away from the rotation axis A1 of the substrate W to a feed side. The edge position is a position in which in plan view, the discharge port of the first organic solvent nozzle 31 is 142.5 mm away from the rotation axis A1 of the substrate W to the home side and in which the discharge port of the second organic solvent nozzle 32 is 42.5 mm away from the rotation axis A1 of the substrate W to the home side. In other words, the center portion is a position in which a discharge region DA (see FIG. 15B) to be described later is located in the center portion of the upper surface (the center portion of the front surface) of the substrate W, and the edge position is a position in which the discharge region DA is located in the circumferential edge portion of the upper surface (the circumferential edge portion of the front surface) of the substrate W.

The first organic solvent nozzle 31 has a form of a two-fluid nozzle which jets minute droplets of the organic solvent. A first organic solvent pipe 37 in which an organic solvent (IPA) of a liquid of room temperature from an organic solvent supply source is supplied to the first organic solvent nozzle 31 and a first gas pipe 38 in which an inert gas (nitrogen gas in the example shown in FIG. 2) serving as an example of a gas from a gas supply source is supplied to the first organic solvent nozzle 31 are connected to the first organic solvent nozzle 31.

In the first organic solvent pipe 37, a first organic solvent valve 39 which switches the supply and the supply stop of the organic solvent from the first organic solvent pipe 37 to the first organic solvent nozzle 31 and a first flow rate adjustment valve 40 which adjusts the opening of the first organic solvent pipe 37 and which adjusts the flow rate of organic solvent discharged from the first organic solvent nozzle 31 are interposed. Although not shown in the figure, the first flow rate adjustment valve 40 includes a valve body within which a valve seat is provided, a valve member which opens and closes the valve seat and an actuator which moves the valve member between an opened position and a closed position. The same is true for the other flow rate adjustment valves.

In the first gas pipe 38, a first gas valve 41 which switches the supply and the supply stop of the gas from the first gas pipe 38 to the first organic solvent nozzle 31 is interposed. Although as an example of the gas supplied to the first organic solvent nozzle 31, nitrogen gas ($N_2$) can be illustrated, inert gases other than nitrogen gas such as dry air and clean air can also be adopted.

As shown in FIG. 5, the first organic solvent nozzle 31 has a substantially cylindrical outline. The first organic solvent nozzle 31 includes an outer cylinder 46 which forms a casing and an inner cylinder 47 which is fitted into the outer cylinder 46.

The outer cylinder 46 and the inner cylinder 47 are coaxially arranged on a central axis A3 common thereto, and are coupled to each other. The internal space of the inner cylinder 47 serves as a linear organic solvent flow path 48 through which the organic solvent from the first organic solvent pipe 37 is passed. Between the outer cylinder 46 and the inner cylinder 47, a cylindrical gas flow path 49 through which the gas supplied from the first gas pipe 38 is passed is formed.

The organic solvent flow path 48 is open as an organic solvent introduction port 50 at the upper end of the inner cylinder 47. The organic solvent from the first organic solvent pipe 37 is introduced via the organic solvent introduction port 50 to the organic solvent flow path 48. The organic solvent flow path 48 is open as a circular organic solvent discharge port 51 having a center on the central axis A3 at the lower end of the inner cylinder 47. The organic solvent introduced to the organic solvent flow path 48 is discharged from the organic solvent discharge port 51.

The gas flow path 49 is a cylindrical gap which has a central axis common to the central axis A3, and is closed in the upper end portions of the outer cylinder 46 and the inner cylinder 47, and is open in the lower ends of the outer cylinder 46 and the inner cylinder 47 as an annular gas discharge port 52 which has a center on the central axis A3 and which surrounds the organic solvent discharge port 51. The lower end portion of the gas flow path 49 has a flow path area smaller than an intermediate portion in the direction of the length of the gas flow path 49, and has a smaller diameter toward a downward direction. In the intermediate portion of the outer cylinder 46, a gas introduction port 53 which communicates with the gas flow path 49 is formed.

The first gas pipe 38 is connected to the gas introduction port 53 in a state in which the first gas pipe 38 penetrates the outer cylinder 46, and the internal space of the first gas pipe 38 communicates with the gas flow path 49. The gas from the first gas pipe 38 is introduced via the gas introduction port 53 into the gas flow path 49 and is discharged from the gas discharge port 52.

While the first gas valve 41 is opened to discharge the gas from the gas discharge port 52, the first organic solvent valve 39 is opened to discharge the organic solvent from the organic solvent discharge port 51, and thus the gas is made to collide with (mixed with) the organic solvent in the vicinity of the first organic solvent nozzle 31, with the result that it is possible to generate minute droplets of the organic solvent and to discharge the organic solvent in spray form.

As shown in FIG. 2, the second organic solvent nozzle 32 has a straight nozzle form which discharges the organic solvent (IPA) in a continuous flow state. A second organic solvent pipe 54 which supplies the liquid of the organic solvent (IPA) of room temperature from the organic solvent supply source to the first organic solvent nozzle 31 is connected to the second organic solvent nozzle 32. In the second organic solvent pipe 54, a second organic solvent valve 55 which switches the supply and the supply stop of the organic solvent from the second organic solvent pipe 54 to the second organic solvent nozzle 32 and a second flow rate adjustment valve 56 which adjusts the opening of the second organic solvent pipe 54 to adjust the flow rate of organic solvent discharged from the second organic solvent nozzle 32 are interposed. When the second organic solvent valve 55 is opened, the organic solvent of the continuous flow supplied from the second organic solvent pipe 54 to the second organic solvent nozzle 32 is discharged from a discharge port set at the lower end of the second organic solvent nozzle 32. When the second organic solvent valve 55 is closed, the supply of the organic solvent from the second organic solvent pipe 54 to the second organic solvent nozzle 32 is stopped.

As shown in FIG. 2, a lower surface supply unit 9 includes a lower surface nozzle 60 which discharges the heating liquid upward, a heating liquid pipe 57 which introduces the heating liquid to the lower surface nozzle 60, a heating liquid valve 58 which is interposed in the heating liquid pipe 57 and a third flow rate adjustment valve 59 which is interposed in the heating liquid pipe 57 and adjusts the opening of the heating liquid pipe 57 to adjust the flow rate of heating liquid discharged upward from the lower surface nozzle 60. When the heating liquid valve 58 is opened, the heating liquid from a heating liquid supply source is supplied at a flow rate corresponding to the opening of the third flow rate adjustment valve 59 from the heating liquid pipe 57 to the lower surface nozzle 60. In this way, the heating liquid at a high temperature (for example, a temperature of 75° C. close to the boiling point (about 80° C.) of IPA) is discharged from the lower surface nozzle 60. The heating liquid supplied to the lower surface nozzle 60 is heated pure water. The type of heating liquid supplied to the lower surface nozzle 60 is not limited to pure water, and may be carbonated water, electrolytic ion water, hydrogen water, ozone water, IPA (isopropyl alcohol), hydrochloric acid water of a dilute concentration (for example, about 10 to 100 ppm) or the like.

Figure 6:
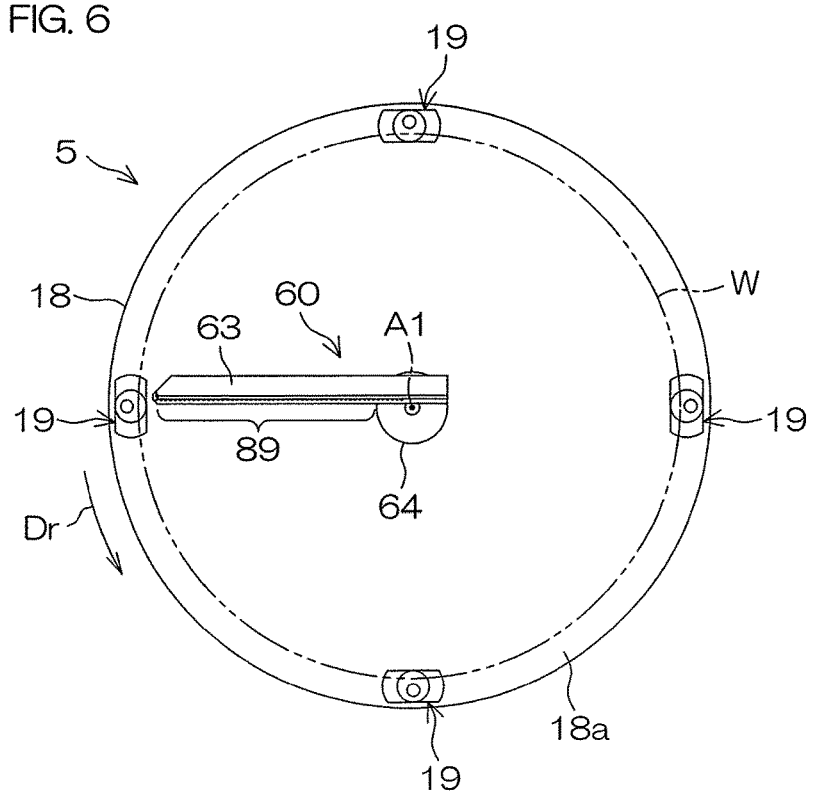
FIG. 6 is a schematic plan view for illustrating a spin chuck and a lower surface nozzle.
Figure 7:
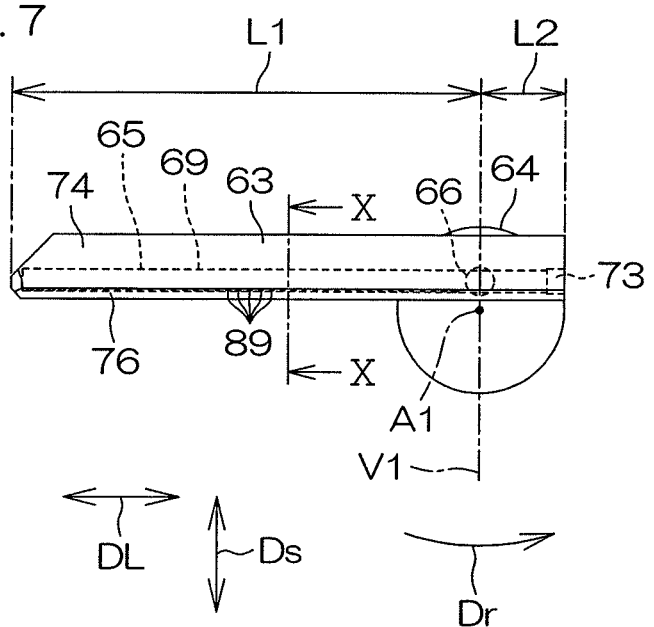
FIG. 7 is a schematic plan view of the lower surface nozzle.
Figure 8:
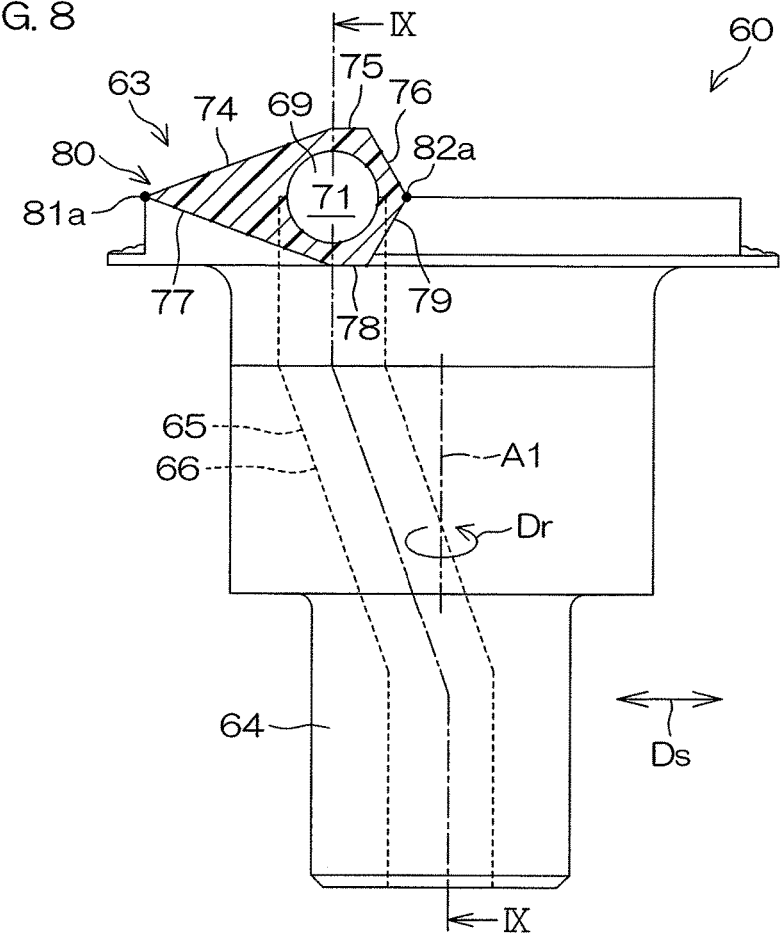
FIG. 8 is a partial cross-sectional view when the lower surface nozzle is seen in the longitudinal direction of a nozzle portion.
Figure 9:
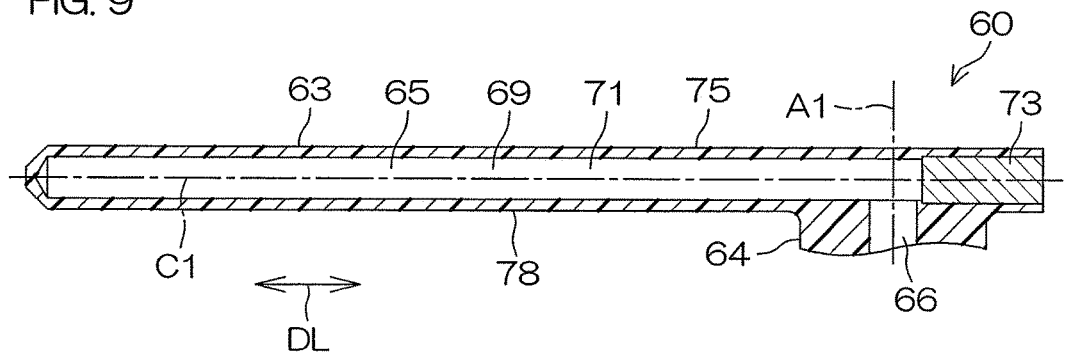
FIG. 9 is a cross-sectional view of the lower surface nozzle taken along line IX-IX shown in FIG. 8.
Figure 10:
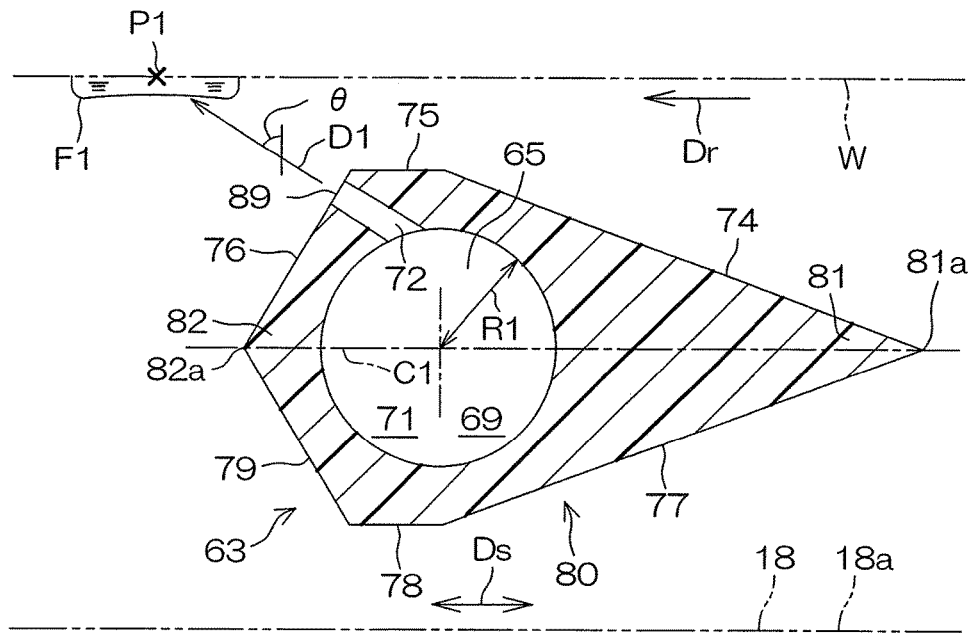
FIG. 10 is a diagram showing a vertical cross section of the nozzle portion taken along line X-X shown in FIG. 7.
Figure 11:
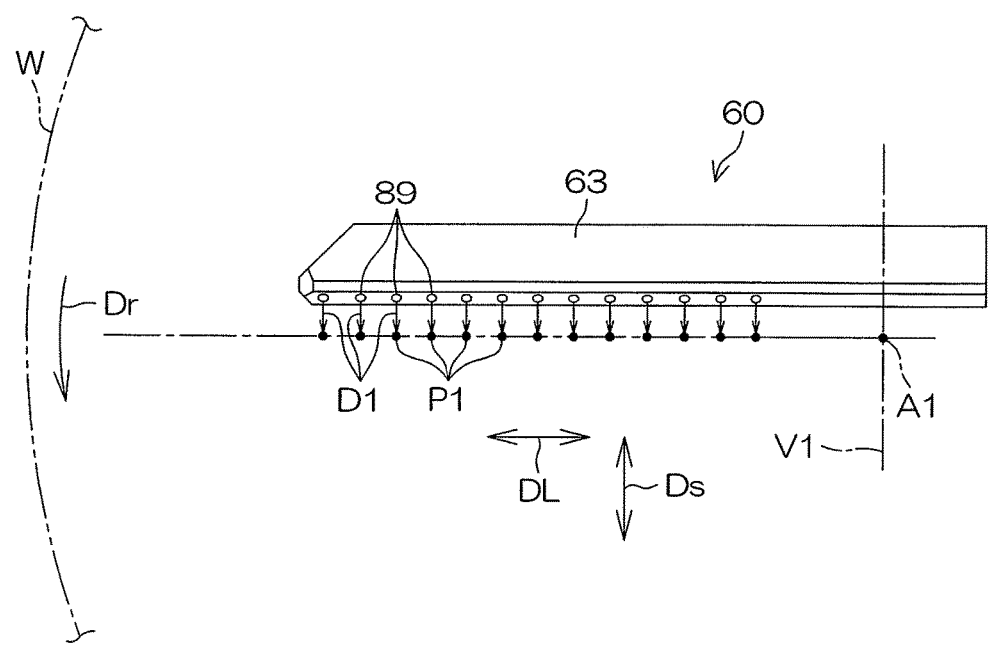
FIG. 11 is a schematic plan view showing a state in which the nozzle portion discharges a heating liquid.

FIG. 6 is a schematic plan view for illustrating the spin chuck 5 and the lower surface nozzle 60. FIG. 7 is a schematic plan view of the lower surface nozzle 60. FIG. 8 is a partial cross-sectional view when the lower surface nozzle is seen in the longitudinal direction of a nozzle portion 63. FIG. 9 is a cross-sectional view of the lower surface nozzle 60 taken along line IX-IX shown in FIG. 8. FIG. 10 is a diagram showing a vertical cross section of the nozzle portion 63 taken along line X-X shown in FIG. 7. FIG. 11 is a schematic plan view showing a state in which the nozzle portion 63 discharges the heating liquid.

The configuration of the lower surface nozzle 60 will be described below with reference to FIGS. 2 and 6 to 9.

The lower surface nozzle 60 has a so-called bar nozzle form in which the nozzle portion 63 is included. As shown in FIG. 6, the lower surface nozzle 60 includes the nozzle portion 63 in which a plurality of discharge ports (heating fluid discharge ports) 89 which discharge the heating liquid are aligned along the radial direction of rotation of the substrate W and a base portion 64 which supports the nozzle portion 63. The lower surface nozzle 60 is formed of a synthetic resin, such as PTFE (polytetrafluoroethylene), which has chemical resistance. The base portion 64 is formed in the shape of a cylinder coaxial with the rotation axis A1. The base portion 64 is located in a position opposite to the center portion of the lower surface of the substrate W. The base portion 64 is protruded upward from the center portion of the upper surface 18a of the spin base 18. The nozzle portion 63 is arranged above the base portion 64. The nozzle portion 63 is arranged between the lower surface of the substrate W and the upper surface 18a of the spin base 18.

As shown in FIG. 7, the nozzle portion 63 includes a root portion which overlaps the base portion 64 in plan view, a tip end portion which is arranged outward in a radial direction with respect to the base portion 64 and an intermediate portion which is extended from the root portion to the tip end portion. A distance L1 in a longitudinal direction DL from an imaginary straight line V1 perpendicularly intersecting both the rotation axis A1 and the longitudinal direction (direction along the radial direction of the rotation) DL to the tip end of the nozzle portion 63 is larger than a distance L2 in the longitudinal direction DL from the imaginary straight line V1 to the root of the nozzle portion 63. A distance in the radial direction from the rotation axis A1 to the tip end of the nozzle portion 63 is smaller than the radius of the substrate W.

As shown in FIG. 8, the lower surface nozzle 60 includes a heating liquid supply path 65 which supplies the heating liquid to a plurality of discharge ports 89. The heating liquid supply path 65 includes a downstream portion 69 which is provided in the nozzle portion 63 and an upstream portion 66 which is provided in the base portion 64. The upstream portion 66 and the downstream portion 69 are connected to each other in a position which is upstream with respect to the plurality of discharge ports 89. The shape of a vertical cross section 80 (see FIG. 8) of the nozzle portion 63 is uniform over the substantially entire region in the longitudinal direction DL.

As shown in FIGS. 8 to 10, the downstream portion 69 of each heating liquid supply path 65 includes a main flow path 71 which guides the heating liquid supplied to the plurality of discharge ports 89 and a plurality of branch flow paths 72 which supply the heating liquid within the main flow path 71 to the plurality of discharge ports 89. As shown in FIG. 9, the main flow path 71 is formed in the shape of a cylinder which is extended in the longitudinal direction DL within the nozzle portion 63. The main flow path 71 is arranged between a plug 73 attached to the root portion of the nozzle portion 63 and the tip end portion of the nozzle portion 63. The flow path area (the area of a cross section perpendicularly intersecting a direction in which the fluid flows) of the main flow path 71 is larger than the flow path area of any of the branch flow paths 72. As shown in FIG. 10, the radius R1 of the cross section of the main flow path 71 is larger than the flow path length (length from the upstream end of the branch flow path 72 to the downstream end of the branch flow path 72) of any of the branch flow paths 72. As shown in FIG. 10, a plurality of branch flow paths 72 are respectively connected to a plurality of discharge ports 89. The upstream end of the branch flow path 72 is connected to the main flow path 71 in a position higher than a horizontal center surface C1 passing through the center of the vertical cross section 80 in the vertical direction. The downstream end of the branch flow path 72 is connected to any one of the plurality of discharge ports 89.

As shown in FIGS. 8 and 10, the outer surface of the nozzle portion 63 includes an upper-side upstream inclination surface 74 which is extended obliquely upward toward the downstream side in a rotation direction Dr, an upper-side horizontal surface 75 which is extended horizontally with respect to the rotation direction Dr from the upper-side upstream inclination surface 74 and an upper-side downstream inclination surface 76 which is extended obliquely downward from the upper-side horizontal surface 75 toward the downstream side in the rotation direction Dr. The outer surface of the nozzle portion 63 further includes a lower-side upstream inclination surface 77 which is extended obliquely downward toward the downstream side in the rotation direction Dr, a lower-side horizontal surface 78 which is extended horizontally with respect to the rotation direction Dr from the lower-side upstream inclination surface 77 and a lower-side downstream inclination surface 79 which is extended obliquely upward from the lower-side horizontal surface 78 toward the downstream side in the rotation direction Dr.

As shown in FIG. 10, the upper-side upstream inclination surface 74 is longer than the upper-side downstream inclination surface 76 in a lateral direction Ds (horizontal direction perpendicularly intersecting the longitudinal direction DL). Similarly, the lower-side upstream inclination surface 77 is longer than the lower-side downstream inclination surface 79 in the lateral direction Ds. The upper-side upstream inclination surface 74 and the lower-side upstream inclination surface 77 intersect each other in a position (upstream end 81a) which is the most upstream in the vertical cross section 80 of the nozzle portion 63. The upper-side downstream inclination surface 76 and the lower-side downstream inclination surface 79 intersect each other in a position (downstream end 82a) which is the most downstream in the vertical cross section 80 of the nozzle portion 63.

As shown in FIG. 10, the vertical cross section 80 of the nozzle portion 63 includes an upstream end portion 81 which is formed in the shape of a convex triangle on the upstream side in the rotation direction Dr and a downstream end portion 82 which is formed in the shape of a convex triangle on the downstream side in the rotation direction Dr. The upper edge of the upstream end portion 81 is part of the upper-side upstream inclination surface 74, and the lower edge of the upstream end portion 81 is part of the lower-side upstream inclination surface 77. Similarly, the upper edge of the downstream end portion 82 is part of the upper-side downstream inclination surface 76, and the lower edge of the downstream end portion 82 is part of the lower-side downstream inclination surface 79.

As shown in FIG. 10, the upstream end portion 81 includes the upstream end 81a which is arranged on the most upstream side in the vertical cross section 80 of the nozzle portion 63. The downstream end portion 82 includes the downstream end 82a which is arranged on the most downstream side in the vertical cross section 80 of the nozzle portion 63. The thickness (the length in the vertical direction) of the upstream end portion 81 is reduced as the upstream end portion 81 is extended close to the upstream end 81a. The thickness (the length in the vertical direction) of the downstream end portion 82 is reduced as the downstream end portion 82 is extended close to the downstream end 82a.

A plurality of discharge ports 89 provided in the nozzle portion 63 are open in the upper-side downstream inclination surface 76. As shown in FIG. 5, a plurality of discharge ports 89 are spaced a distance apart in the longitudinal direction DL of the nozzle portion 63. The opening areas of the discharge ports 89 are equal to each other. However, the opening areas of the discharge ports 89 may be made to differ from each other. For example, the opening area of the discharge port 89 on the circumferential edge side of the substrate W may be larger than the opening area of the discharge port 89 on the side of the rotation axis A1. Since the circumferential edge side of the substrate W which is being rotated is lower in temperature than the center side, the opening areas of the discharge ports are made to differ from each other, and thus it is possible to uniformly heat the substrate W in the radial direction.

As shown in FIG. 9, the discharge port 89 discharges the heating liquid in a discharge direction D1 toward a liquid landing position P1 within the lower surface of the substrate W. The liquid landing position P1 is a position which is downstream with respect to the discharge port 89 in the rotation direction Dr. The liquid landing position P1 is a position which is away from the center of the lower surface of the substrate W. The discharge direction D1 is an obliquely upward direction which points from the discharge port 89 toward the liquid landing position P1. The discharge direction D1 is inclined to the downstream side in the rotation direction Dr with respect to the lower surface of the substrate W. An inclination angle θ in the discharge direction D1 with respect to the vertical direction is, for example, 30°. A distance from each discharge port 89 to the lower surface of the substrate W in the vertical direction is, for example, 1.3 mm.

As shown in FIG. 11, the discharge ports 89 and the liquid landing position P1 are aligned in the lateral direction Ds when seen in a direction perpendicularly intersecting the rotation axis A1, that is, when seen in plan view. The liquid landing position P1 is arranged 2.25 mm away from the discharge ports 89 in the discharge direction D1. The discharge direction D1 is a direction which is parallel to the imaginary straight line V1 in plan view, and is a direction which intersects (in this case, perpendicularly intersects) the radial direction of the substrate W in plan view. The discharge port 89 discharges the processing liquid in a direction along the rotation direction Dr of the substrate W in plan view.

As shown in FIG. 10, the processing liquid discharged from the discharge port 89 is spread along the lower surface of the substrate W by a force produced when the liquid lands the liquid landing position P1 so as to form a liquid film of the heating liquid which covers the liquid landing position P1. The liquid landing position P1 is a position which is away from the center (the rotation axis A1) of the lower surface of the substrate W.

As shown in FIG. 2, the processing unit 2 further includes, on the upper surface of the substrate W held by the spin chuck 5, a gas nozzle (opposite member) 100 which supplies the gas. A nozzle movement unit 99 which moves the gas nozzle 100 is coupled to the gas nozzle 100.

Figure 12:
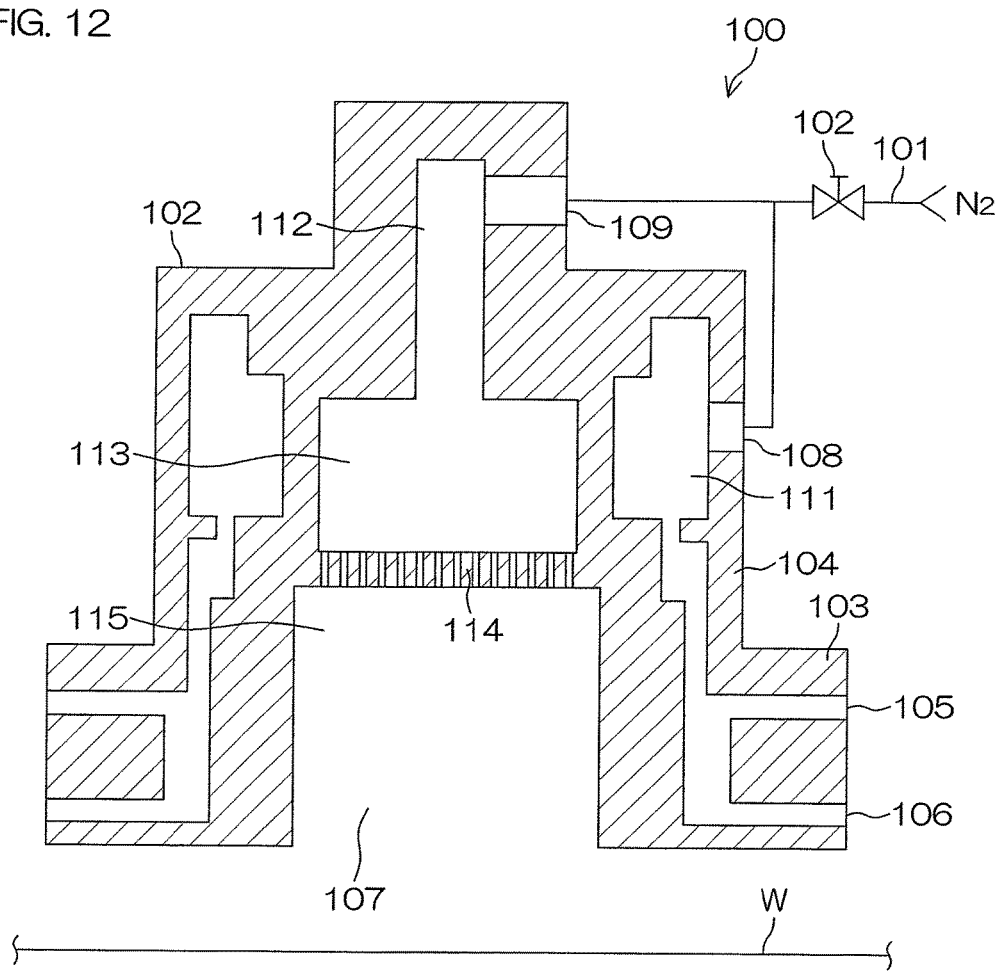
FIG. 12 is a schematic vertical cross-sectional view for illustrating an example of the configuration of a gas nozzle included in the processing unit.

FIG. 12 is a schematic vertical cross-sectional view for illustrating an example of the configuration of the gas nozzle 100. A second gap pipe 101 is coupled to the gas nozzle 100. In the second gap pipe 101, a second gas valve 102 which opens and closes its flow path is interposed. The gas nozzle 100 is a nozzle which covers an area above the substrate W by a nitrogen gas atmosphere. The gas nozzle 100 includes a cylindrical nozzle main body 104 which has a flange portion 103 at a lower end. In an outer circumferential surface which is the side surface of the flange portion 103, an upper-side gas discharge port 105 and a lower-side gas discharge port 106 are individually formed in the shape of a ring and are open outward. The upper-side gas discharge port 105 and the lower-side gas discharge port 106 are spaced a distance apart in the vertical direction. In the lower surface of the nozzle main body 104, a center gas discharge port 107 is arranged.

In the nozzle main body 104, gas introduction ports 108 and 109 through which nitrogen gas is supplied from the second gap pipe 101 are formed. Individual nitrogen gas pipes may be coupled to the gas introduction port 108 and 109. Within the nozzle main body 104, a cylindrical gas flow path 111 is formed which connects the gas introduction port 108 to the upper-side gas discharge port 105 and the lower-side gas discharge port 106. Within the nozzle main body 104, a cylindrical gas flow path 112 communicating with the gas introduction port 109 is formed therearound. A buffer space 113 communicates with a lower portion of the gas flow path 112. The buffer space 113 further communicates with a space 115 therebelow via a punching plate 114. The space 115 is open to the center gas discharge port 107.

The nitrogen gas introduced from the gas introduction port 108 is supplied via the gas flow path 111 to the upper-side gas discharge port 105 and the lower-side gas discharge port 106, and is discharged radially from these gas discharge ports 105 and 106. In this way, the two radial gas currents overlapping each other in an up/down direction are formed above the substrate W. On the other hand, the nitrogen gas introduced from the gas introduction port 109 is stored in the buffer space 113 via the gas flow path 112, is further passed through the punching plate 114 to be diffused, is thereafter passed through the space 115 and is discharged downward from the center gas discharge port 107 to the upper surface of the substrate W. The nitrogen gas hits the upper surface of the substrate W to change its direction, and thereby forms a nitrogen gas current in a radial direction above the substrate W.

Hence, the radial gas currents of three layers consisting of the radial gas current formed with the nitrogen gas discharged from the center gas discharge port 107 and the radial gas currents of two layers discharged from the gas discharge portions 105 and 106 are formed above the substrate W. The radial gas currents of three layers protect the upper surface of the substrate W. In particular, as will be described later, when the substrate W is rotated at a high speed, the upper surface of the substrate W is protected by the radial gas currents of three layers, with the result that it is possible to prevent droplets and mist from being adhered to the front surface of the substrate W.

As shown in FIG. 2, the processing cup 10 is arranged outward (in a direction away from the rotation axis A1) with respect to the substrate W held by the spin chuck 5. The processing cup 10 surrounds the spin base 18. When in a state in which the spin chuck 5 rotates the substrate W, the processing liquid is supplied to the substrate W, the processing liquid supplied to the substrate W is shaken off to the surroundings of the substrate W. When the processing liquid is supplied to the substrate W, the upper end portion 10a of the processing cup 10 which is open upward is arranged above the spin base 18. Hence, the processing liquid, such as the chemical liquid, the rinse liquid or the organic solvent, which is discharged to the surroundings of the substrate W is received by the processing cup 10. Then, the processing liquid received by the processing cup 10 is fed to a collection device or a waste liquid device which is not shown.

Figure 13:
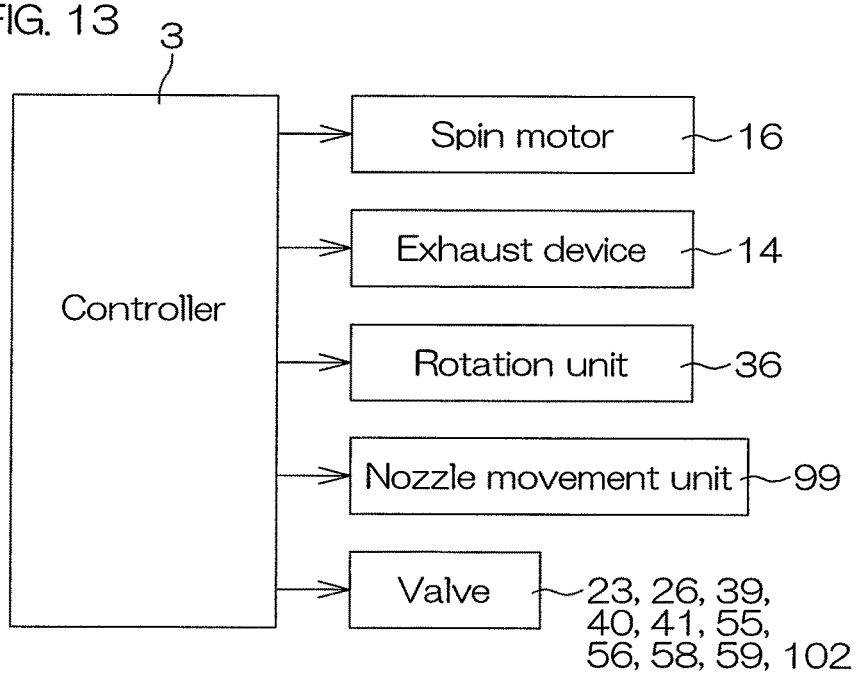
FIG. 13 is a block diagram for illustrating the electrical configuration of a main portion of the substrate processing apparatus.

FIG. 13 is a block diagram for illustrating the electrical configuration of a main portion of the substrate processing apparatus 1. The controller 3 is formed with, for example, a microcomputer. The controller 3 includes a computation unit such as a CPU, a storage unit such as a fixed memory device or a hard disk drive and an input/output unit. In the storage unit, programs which are executed by the computation unit are stored.

The controller 3 controls, according to predetermined programs, the operations of the spin motor 16, the exhaust device 14, the rotation unit 36, the nozzle movement unit 99 and the like. The controller 3 further controls the opening/closing operations of the chemical liquid valve 23, the rinse liquid valve 26, the first organic solvent valve 39, the first flow rate adjustment valve 40, the first gas valve 41, the second organic solvent valve 55, the second flow rate adjustment valve 56, the heating liquid valve 58, the third flow rate adjustment valve 59, the second gas valve 102 and the like.

Figure 14:
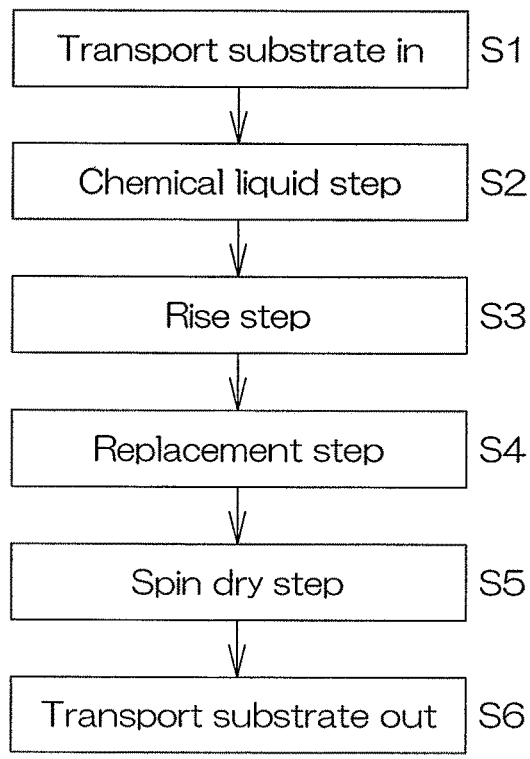
FIG. 14 is a flow diagram for illustrating an example of substrate processing performed by the substrate processing apparatus.

FIG. 14 is a flow diagram for illustrating an example of substrate processing performed by the substrate processing apparatus 1. A description will be given with reference to FIGS. 2, 13 and 14.

The unprocessed substrate W is transported with the transfer robots IR and CR from the carrier C into the processing unit 2, is transported into the processing chamber 4, is passed to the spin chuck 5 with the front surface (pattern formation surface) of the substrate W directed upward and is held by the spin chuck 5 (S1: substrate holding step). Before the substrate W is transported thereinto, the first and second organic solvent nozzles 31 and 32 are retracted to a home position which is set on the side of the spin chuck 5. The gas nozzle 100 is also retracted to the home position which is set on the side of the spin chuck 5.

After the transfer robot CR is retracted to the outside of the processing unit 2, the controller 3 performs a chemical liquid step (step S2). Specifically, the controller 3 drives the spin motor 16 to rotate the spin base 18 at a predetermined liquid processing rotation speed. The controller 3 also opens the chemical liquid valve 23. In this way, the chemical liquid is supplied from the chemical liquid nozzle 21 to the upper surface of the substrate W which is being rotated. The chemical liquid supplied is passed over the entire surface of the substrate W by centrifugal force, and chemical liquid processing using the chemical liquid is performed on the substrate W. When a predetermined period of time has elapsed since the start of the discharge of the chemical liquid, the controller 3 closes the chemical liquid valve 23 to stop the discharge of the chemical liquid from the chemical liquid nozzle 21.

Then, the controller 3 performs a rinse step (step S3). The rinse step is a step in which the chemical liquid on the substrate W is replaced with the rinse liquid, and in which the chemical liquid is removed from the top of the substrate W. Specifically, the controller 3 opens the rinse liquid valve 26. In this way, the rinse liquid is supplied from the rinse liquid nozzle 24 to the upper surface of the substrate W which is being rotated. The rinse liquid supplied is passed over the entire surface of the substrate W by centrifugal force. The chemical liquid adhered to the top of the substrate W is washed off by the rinse liquid.

When a predetermined period of time has elapsed since the start of the supply of the rinse liquid, the controller 3 controls the spin motor 16 to reduce the rotation speed of the substrate W in a stepwise manner from the liquid processing rotation speed (for example, about 300 rpm) to a paddle speed (for example, about 10 rpm), and thereafter the rotation speed of the substrate W is maintained at the paddle speed (paddle rinse step). In this way, on the upper surface of the substrate W, a liquid film of the rinse liquid covering the entire upper surface of the substrate W is supported so as to be formed in the shape of a paddle. When a predetermined period of time has elapsed since the start of the supply of the rinse liquid, the controller 3 closes the rinse liquid valve 26 to stop the discharge of the rinse liquid from the rinse liquid nozzle 24.

Then, the controller 3 performs a replacement step (step S4). The replacement step is a step in which the rinse liquid on the substrate W is replaced with the organic solvent that is a low surface tension liquid whose surface tension is lower than that of the rinse liquid (water). The controller 3 moves, upward, the first and second organic solvent nozzles 31 and 32 from the home position on the side of the spin chuck 5 to the center portion of the upper surface of the substrate W. Then, the first organic solvent valve 39 and/or the second organic solvent valve 55 is opened, and thus the liquid of the organic solvent is supplied to the upper surface (front surface) of the substrate W. The organic solvent supplied is passed over the entire surface of the substrate W by centrifugal force, and replaces the rinse liquid on the substrate W.

In the replacement step (S4), at the same time when the supply of the organic solvent to the upper surface of the substrate W is started, the controller 3 opens the heating liquid valve 58. In this way, the heating liquid is discharged upward from the discharge ports 89 of the lower surface nozzle, and the heating liquid is supplied to the lower surface of the substrate W. As shown in FIGS. 10 and 11, the heating liquid is discharged from a plurality of discharge ports 89 aligned along the longitudinal direction DL to the lower surface (rear surface) of the substrate W. In parallel with the heating liquid is discharged from the discharge ports 89, the substrate W is rotated, and thus it is possible to supply the heating liquid to the entire lower surface (rear surface) of the substrate W.

When a predetermined period of time has elapsed since the start of the supply of the organic solvent, the controller 3 controls the organic solvent supply unit 8 to stop the supply of the organic solvent to the upper surface of the substrate W.

Thereafter, the controller 3 retracts the first and second organic solvent nozzles 31 and 32 to the home position, and controls the nozzle movement unit 99 to locate the gas nozzle 100, from the home position on the side of the spin chuck 5, in an upper position (position indicated by a solid line in FIG. 15D) above the substrate W. In a state in which the gas nozzle 100 is located in the upper position and in a close position which will be described subsequently, the gas nozzle 100 is opposite the center portion of the upper surface of the substrate W.

Thereafter, the controller 3 performs a spin dry step (step S5). In the spin dry step (S5), the controller 3 controls the nozzle movement unit 99 to lower the gas nozzle 100 from the upper position to the close position (position indicated by a solid line in FIG. 15E) closer to the substrate W as compared with the upper position and to locate the gas nozzle 100 in the close position. In the spin dry step (S5), the controller 3 controls the spin motor 16 to rotate the substrate W at a high speed, that is, at a dry rotation speed. In this way, liquid components on the substrate W are shaken off by centrifugal force.

When a predetermined period has elapsed since the start of the spin dry step (S5), the controller 3 controls the spin motor 16 to stop the rotation of the spin chuck 5. Thereafter, the transfer robot CR enters the processing unit 2 and transports the processed substrate W out of the processing unit 2 (step S6). The substrate W is passed from the transfer robot CR to the transfer robot IR and is stored in the carrier C by the transfer robot IR.

Figure 15A:
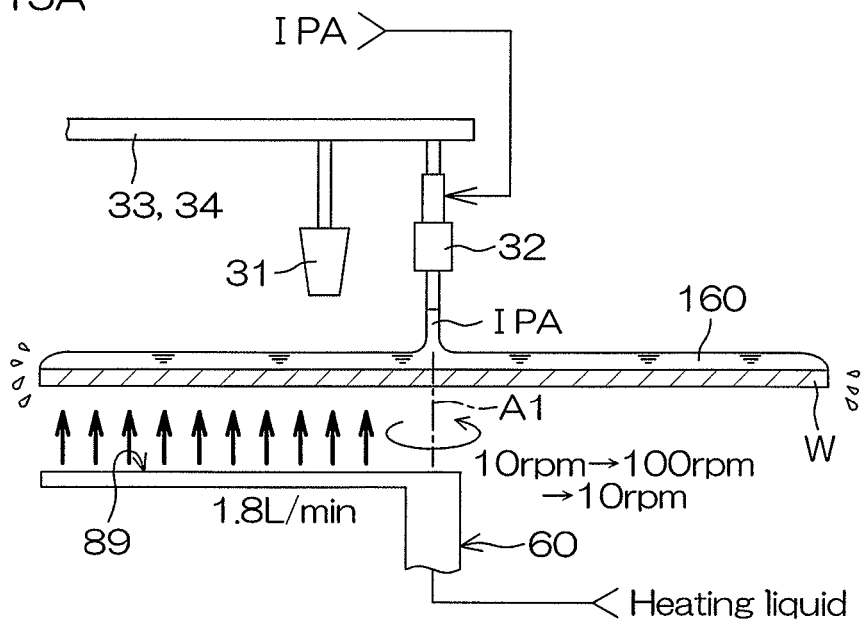
FIGS. 15A to 15D are schematic cross-sectional views for illustrating a replacement step.
Figure 15B:
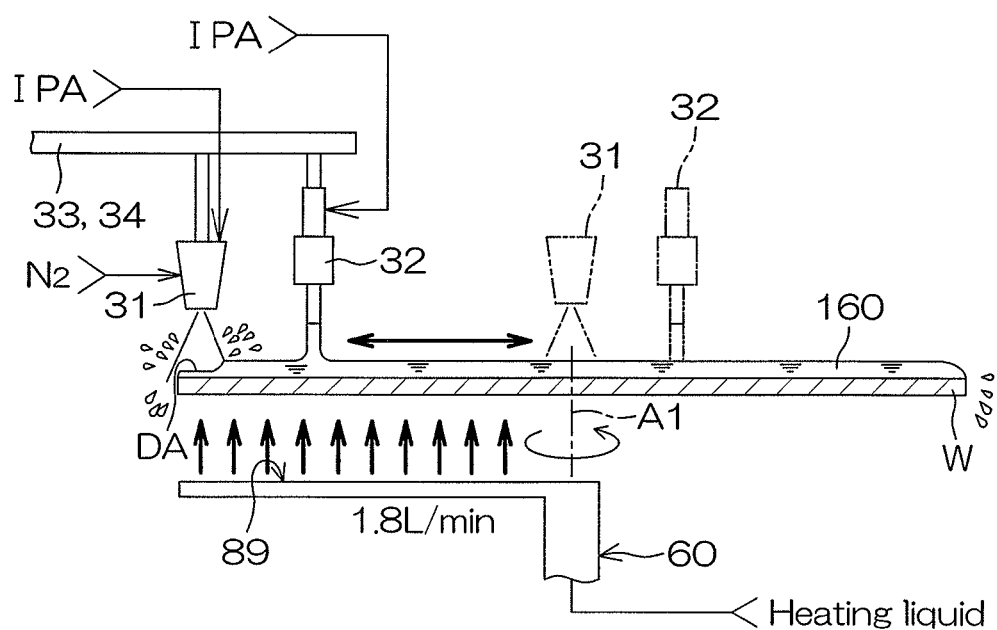
Figure 15C:
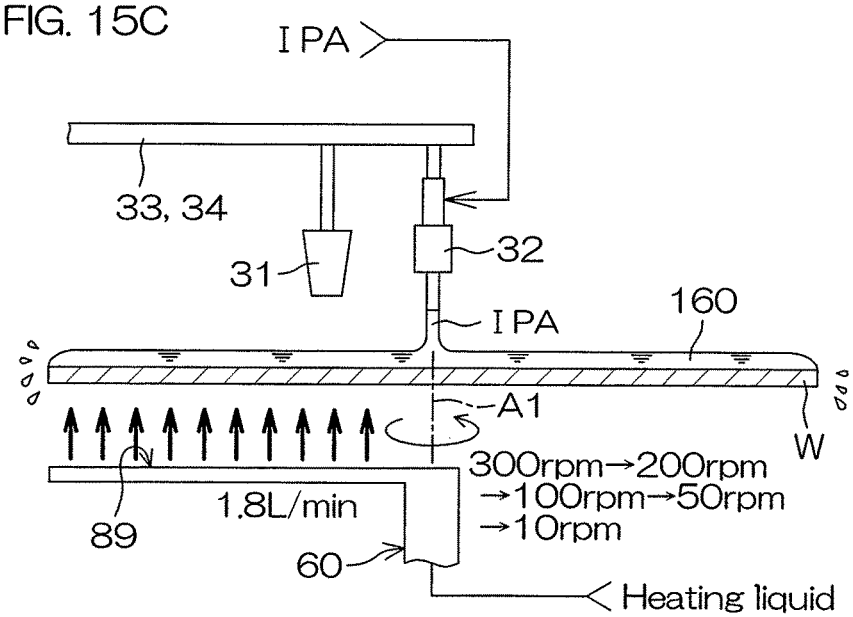

FIGS. 15A to 15D are schematic cross-sectional views for illustrating steps in the replacement step (S4). FIGS. 15E and 15F are schematic cross-sectional views for illustrating the spin dry step (S5). FIG. 16 is a time chart for illustrating the replacement step (S4) and the spin dry step (S5).

Figure 15D:
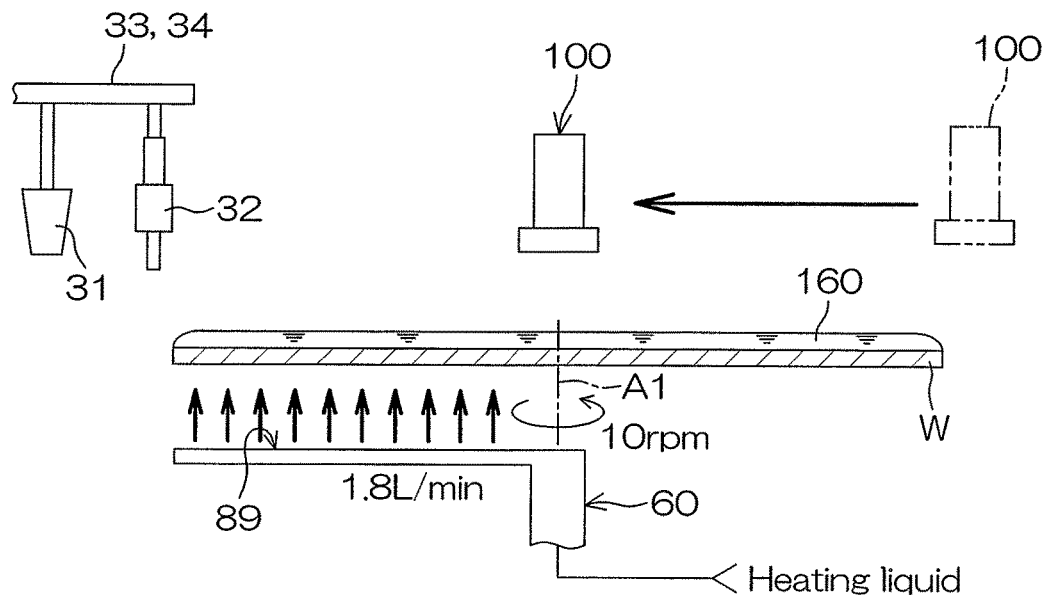
Figure 15E:
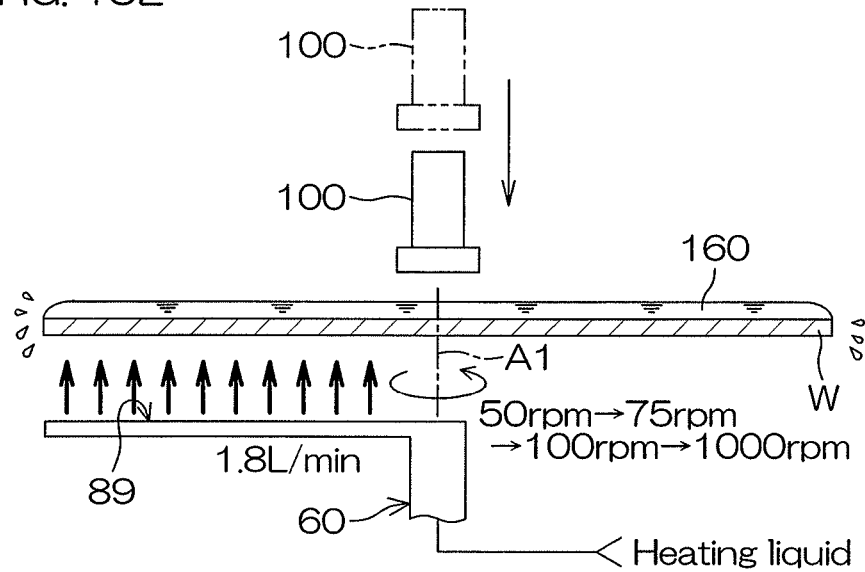
FIG. 15E is a schematic cross-sectional view for illustrating a first spin dry step.
Figure 15F:
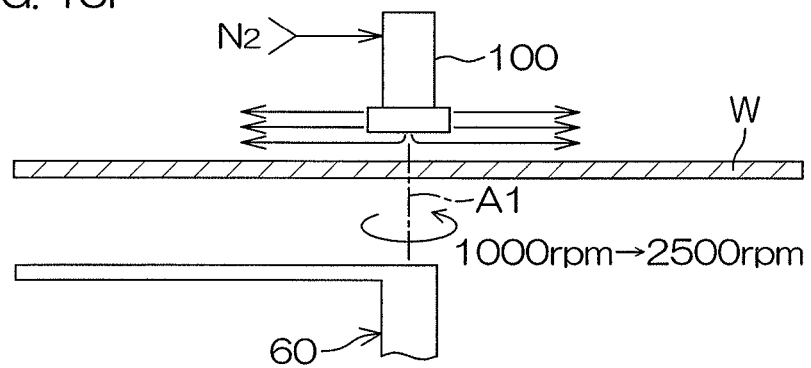
FIG. 15F is a schematic cross-sectional view for illustrating a second spin dry step.
Figure 17:
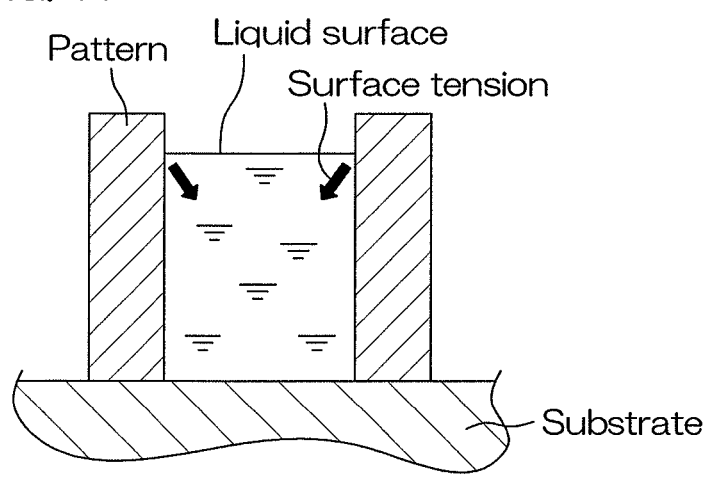
FIG. 17 is a schematic cross-sectional view for illustrating principles of the collapse of a pattern caused by surface tension.

The replacement step (S4) includes a first liquid film formation step T1 (see FIG. 15A), a droplet supply step T2 (see FIG. 15B), a second liquid film formation step T3 (see FIG. 15C) and a nozzle replacement step (a post-heating step, a paddle step) T4 (see FIG. 15D). When the first liquid film formation step T1, the droplet supply step T2 and the second liquid, film formation step T3 are collectively described, they are referred to as an organic solvent supply step (low surface tension liquid supply step) T1 to T3.

The first liquid film formation step T1 (see FIG. 15A) is a step in which while the substrate W is being rotated at a relatively low speed, the organic solvent is supplied to the upper surface (front surface) of the substrate W, and in which on the upper surface of the substrate W, a liquid film 160 of the organic solvent covering the entire upper surface is formed. Before the start of the first liquid film formation step T1, the controller 3 controls the rotation unit 36 (see FIG. 2) to move the first and second organic solvent nozzles 31 and 32 to a cover center position (the positions of the first and second organic solvent nozzles 31 and 32 shown in FIG. 15A) in which the second organic solvent nozzle 32 is located above the center portion of the upper surface of the substrate W. After the first and second organic solvent nozzles 31 and 32 are located in the cover center position, the controller 3 opens the second organic solvent valve 55. In this way, the organic solvent is discharged from the second organic solvent nozzle 32 (cover IPA discharge) and lands the center portion of the upper surface of the substrate W. The flow rate of organic solvent discharged from the second organic solvent nozzle 32 is set at, for example, about 0.3 (liters/minute). The organic solvent is supplied to the upper surface of the substrate W, and thus the rinse liquid contained in the liquid film of the rinse liquid on the upper surface of the substrate W is sequentially replaced with the organic solvent. In this way, on the upper surface of the substrate W, the liquid film 160 of the organic solvent covering the entire upper surface of the substrate W is supported so as to be formed in the shape of a paddle. The paddle refers to a state in which the substrate W is rotated at zero speed or a low speed, and in which since no centrifugal force or a low centrifugal force alone acts on the organic solvent, the organic solvent is left on the upper surface of the substrate W to form a liquid film.

In synchronization with the start of the first liquid film formation step T1, the controller 3 opens the heating liquid valve 58. In this way, the heating liquid is discharged upward from the discharge ports 89 of the lower surface nozzle 60 and lands the lower surface of the substrate W. The flow rate of heating liquid discharged from the lower surface nozzle 60 is set at, for example, about 1.8 (liters/minute). The flow rate of heating liquid discharged is set such that the heating liquid is prevented from flowing around onto the side of the front surface from the circumferential edge portion of the substrate W.

In the preferred embodiment, the heating liquid enters, from the discharge ports 89, the lower surface of the substrate W at an angle which is inclined only by an inclination angle θ with respect to the vertical direction. The heating liquid is supplied from a plurality of discharge ports 89. In this way, in the present preferred embodiment, the splashes of the heating liquid are unlikely to be produced on the lower surface of the substrate, and the adherence of the splashes of the heating liquid to the front surface of the substrate W is reduced.

Furthermore, in the present preferred embodiment, the discharge ports 89 discharge, when seen from the upper surface, the heating liquid in a direction intersecting the radial direction of the substrate W and in a direction along the rotation direction Dr of the substrate W. Hence, the heating liquid is unlikely to flow around from the lower surface of the substrate W onto the front surface.

Since in the first liquid film formation step T1, the heating fluid is supplied to the lower surface (rear surface) of the substrate W, it is possible to perform the first liquid film formation step T1 while heating the liquid film of the organic solvent on the substrate W. In this way, it is possible to enhance the performance of the replacement from the rinse liquid to the organic solvent.

In the first liquid film formation step T1, the rotation speed of the substrate W is changed as follows. That is, for example, for about 3.5 seconds after the start of the first liquid film formation step T1, the rotation speed of the substrate W is maintained at the paddle speed, and thereafter the rotation of the substrate W is accelerated to an intermediate rotation speed (for example, about 100 rpm) lower than the liquid processing rotation speed described previously and is maintained at the intermediate rotation speed for about 6 seconds. Thereafter, the rotation of the substrate W is decelerated to the paddle speed and is maintained at the paddle speed for about 2.5 seconds. When a predetermined period of time (for example, about 12 seconds) has elapsed since the start of the first liquid film formation step T1, the first liquid film formation step T1 is completed, and then the droplet supply step T2 (see FIG. 15B) is started.

The droplet supply step T2 is a step in which while the substrate W is being rotated, both the droplets of the organic solvent and the continuous flow of the organic solvent are supplied to the upper surface of the substrate W. With timing of the start of the droplet supply step T2, the controller 3 accelerates the rotation of the substrate W to an organic solvent processing speed (for example, about 300 rpm) and maintains it at the organic solvent processing speed. The controller 3 also opens the first organic solvent valve 39 and the first gas valve 41. In this way, the organic solvent and the inert gas are simultaneously supplied to the first organic solvent nozzle 31 which is a two-fluid nozzle, and the organic solvent and the inert gas supplied are mixed in the vicinity of the discharge port (the organic solvent discharge port 51 (see FIG. 5)) outside the first organic solvent nozzle 31. In this way, a jet flow of the minute droplets of the organic solvent is formed, and the jet flow of the droplets of the organic solvent is discharged from the first organic solvent nozzle 31 (two-fluid IPA discharge). Hence, the circular discharge region DA is formed on the upper surface of the substrate W. The flow rate of organic solvent discharged from the first organic solvent nozzle 31 is set at, for example, about 0.1 (liters/minute).

In the droplet supply step T2 (see FIG. 15B), the discharge of the continuous flow is continued following the first liquid film formation step T1 (cover IPA discharge).

In the droplet supply step T2, the controller 3 controls the rotation unit 36 to reciprocate the first and second organic solvent nozzles 31 and 32, between the center position (position shown in FIG. 3) and the edge position (position shown in FIG. 4), horizontally along the locus X1 (half-scan). The movement speed (that is, the scan speed of the discharge region DA) of the first and second organic solvent nozzles 32 is set, for example, at about 7 mm/second.

Since the second organic solvent nozzle 32 is moved between the center position (position shown in FIG. 3) and the edge position (position shown in FIG. 4) while the substrate W is being rotated, the upper surface of the substrate W is scanned by the discharge region DA, and the position of the discharge region DA is passed through the entire upper surface of the substrate W. Hence, the droplets of the organic solvent jetted from the first organic solvent nozzle 31 are supplied to the entire upper surface of the substrate W, and thus the entire upper surface of the substrate W is uniformly processed. The organic solvent supplied to the upper surface of the substrate W is discharged from the circumferential edge portion of the substrate W to the outside of the substrate W.

A physical force is applied by the collision of the droplets of the organic solvent to the discharge region DA of the droplets of the organic solvent on the upper surface (front surface) of the substrate W. Thus, it is possible to enhance the performance of the replacement with the organic solvent in the discharge region DA. In general, the performance of the replacement with the organic solvent in the outer circumferential portion of the upper surface (front surface) of the substrate W is considered to be low. However, in the outer circumferential portion of the upper surface (front surface) of the substrate W, the discharge region DA is set, the droplets of the low surface tension liquid are supplied and thus it is possible to improve the performance of the replacement with the organic solvent in the outer circumferential portion of the upper surface (front surface) of the substrate W.

Since before the droplet supply step T2 is performed, the first liquid film formation step T1 is performed, when in the droplet supply step T2, the discharge of the droplets of the organic solvent is started, the droplets of the organic solvent discharged from the first organic solvent nozzle 31 collide with the liquid film 160 of the organic solvent covering the discharge region DA. In other words, when the discharge of the droplets of the organic solvent is started, it is possible to prevent the droplets of the organic solvent from directly colliding with the upper surface (front surface) of the substrate W in a dry state.

In the droplet supply step T2, the droplets of the organic solvent in parallel with a jet of the first organic solvent nozzle 31, the continuous flow of the organic solvent from the second organic solvent nozzle 32 is discharged to the upper surface of the substrate W. In this way, in the droplet supply step T2, on the upper surface of the substrate W, the liquid film 160 of the organic solvent covering the entire upper surface can be retained continuously. Hence, since in the droplet supply step T2, the upper surface of the substrate W can be prevented from being exposed from the liquid film 160, it is possible to further prevent the droplets of the organic solvent from directly colliding with the upper surface (front surface) of the substrate W in a dry state.

When a predetermined period of time (for example, about 61 seconds) has elapsed since the start of the droplet supply step T2, the droplet supply step T2 is completed, and then the second liquid film formation step T3 (see FIG. 15C) is started.

Even in the droplet supply step T2, the supply of the heating liquid to the lower surface of the substrate W is continued. Hence, it is possible to perform the droplet supply step T2 while warming the liquid film of the organic solvent on the substrate W. In this way, it is possible to enhance the performance of the replacement with the organic solvent.

The second liquid film formation step T3 (see FIG. 15C) is a step in which the organic solvent is supplied to the upper surface of the substrate W while decelerating the rotation of the substrate W to the paddle speed, and in which on the upper surface of the substrate W, the liquid film 160 of the organic solvent covering the entire upper surface is formed.

As in the first liquid film formation step T1, in the second liquid film formation step T3, the first and second organic solvent nozzles 31 and 32 are located in the cover center position (the positions of the first and second organic solvent nozzles 31 and 32 shown in FIG. 15A) in a stationary state. As in the first liquid film formation step T1, in the second liquid film formation step T3, the organic solvent is discharged only from the second organic solvent nozzle 32 (cover IPA discharge) but the organic solvent is not discharged from the first organic solvent nozzle 31.

Hence, when the second liquid film formation step T3 is started, the controller 3 closes the first organic solvent valve 39 and the first gas valve 41 and controls the rotation unit 36 to move the first and second organic solvent nozzles 32 to the cover center position (the positions of the first and second organic solvent nozzles 31 and 32 shown in FIG. 15A) and to stop them in the position.

In this way, the organic solvent is discharged from the second organic solvent nozzle 32 and lands the center portion of the upper surface of the substrate W. The flow rate of organic solvent discharged from the second organic solvent nozzle 32 is set at, for example, about 0.3 (liters/minute).

In the second liquid film formation step T3, the rotation speed of the substrate W is changed as described below. That is, for example, for about 2.0 seconds after the start of the second liquid film formation step T3, the rotation speed of the substrate W is maintained at the organic solvent processing speed (for example, about 300 rpm), and thereafter the rotation of the substrate W is reduced from the organic solvent processing speed to the paddle speed (for example, about 10 rpm), for example, in four stages (about 300 rpm→about 200 rpm (for about 1.0 second)→about 100 rpm (for about 1.0 second)→about 50 rpm (for about 2.0 seconds)→about 10 rpm).

Even in the second liquid film formation step T3 (see FIG. 15C), the supply of the heating liquid to the lower surface of the substrate W is continued. Hence, it is possible to perform the second liquid film formation step T3 while warming the liquid film of the organic solvent on the substrate W. In this way, it is possible to enhance the performance of the replacement with the organic solvent.

When a predetermined period of time (for example, 10.0 seconds) has elapsed after the deceleration to the paddle speed, the first organic solvent valve 39 is closed, and thus the supply of the organic solvent to the upper surface of the substrate W is stopped. In this way, the second liquid film formation step T3 is completed. Then, the post-heating step T4 (see FIG. 15D) is started.

The post-heating step T4 is a step in which before the start of the spin dry step (S5), the heating fluid is supplied to the rear surface of the substrate W, and in which the temperature of the substrate W at the start of the spin dry step (S5) is set at a predetermined high temperature. In other words, since the supply of the organic solvent to the front surface of the substrate W is continued until the start of the post-heating step T4, a heat loss caused by the addition of the organic solvent occurs. By contrast, in the post-heating step T4, the supply of the organic solvent to the front surface of the substrate W is stopped, and thus a heat loss on the substrate is reduced. In this state, heating warm water is supplied to the rear surface of the substrate W. In this way, at the start of the spin dry step (S5), the substrate W is made to reliably reach the predetermined high temperature.

In the post-heating step T4, on the nozzle located above the substrate W, an operation of replacing the first and second organic solvent nozzles 31 and 32 with the gas nozzle 100 is performed. Specifically, the controller 3 controls the rotation unit 36 (see FIG. 2) to retract the first and second organic solvent nozzles 31 and 32 from the cover center position to the home position. It takes, for example, about 2.5 seconds to retract the first and second organic solvent nozzles 31 and 32. After the retraction of the first and second organic solvent nozzles 31 and 32, the gas nozzle 100 is located from the home position on the side of the spin chuck 5 to the upper position set above the center portion of the upper surface of the substrate W. It takes, for example, about 4.5 seconds to draw the gas nozzle 100.

In the post-heating step T4, the rotation speed of the substrate W is maintained at the paddle speed. Hence, on the upper surface of the substrate W, the liquid film 160 of the organic solvent covering the entire upper surface is supported so as to be formed in the shape of a paddle.

In the post-heating step T4, the supply of the heating liquid to the lower surface of the substrate W is continued following the second liquid film formation step T3. In other words, in the post-heating step T4, in a state in which the supply of the organic solvent to the upper surface (front surface) of the substrate W is stopped, the heating fluid is supplied to the lower surface (rear surface) of the substrate W.

As described above, the flow rate of heating liquid discharged from the lower surface nozzle 60 is set such that the heating liquid is prevented from flowing around onto the side of the upper surface (front surface) of the substrate W from the circumferential edge portion of the substrate W. Since the discharge ports 89 of the lower surface nozzle 60 discharge the heating liquid in a direction perpendicularly intersecting the radial direction of the substrate W, even when in the post-heating step T4, the supply of the organic solvent to the upper surface (front surface) of the substrate W is stopped, it is possible to heat the liquid film 160 of the organic solvent while reliably preventing the heating liquid from flowing around onto the upper surface (front surface) of the substrate W.

Since the heating fluid is discharged from a plurality of discharge ports 89 aligned along the longitudinal direction DL to the lower surface (rear surface) of the substrate W, in the post-heating step T4, the liquid film 160 of the organic solvent can be heated over the entire front surface of the substrate W.

Since in the post-heating step T4, the substrate W is rotated at the paddle speed, on the upper surface of the substrate W, the liquid film 160 of the organic solvent covering the upper surface is supported so as to be formed in the shape of a paddle. Hence, before the start of the spin dry step after the replacement step, the front surface (pattern formation surface) of the substrate W can be prevented from being exposed from the liquid film. When the front surface (pattern formation surface) of the substrate W is partially exposed, the cleanliness of the substrate W may be lowered by particle generation, and the uniformity of the processing may be lowered. However, in the preferred embodiment, the upper surface (front surface) of the substrate W can be prevented from being exposed from the liquid film 160 of the organic solvent, and thus it is possible to prevent the lowering of the cleanliness of the substrate W and the lowering of the uniformity of the processing.

When the gas nozzle 100 is located in the upper position, the post-heating step T4 is completed, and then the spin dry step (S5) is started.

In the preferred embodiment, the spin dry step (S5) includes a first spin dry step T5 (see FIG. 15E) and a second spin dry step T6 (see FIG. 15F).

The first spin dry step T5 is a step in which before the start of the second spin dry step T6, the rotation speed of the substrate W is stepwise increased to a predetermined first dry speed (for example, about 1000 rpm) in a stepwise manner. The controller 3 controls the spin motor 16 to increase the rotation speed of the substrate W, from the paddle speed, for example, in four stages (about 10 rpm→about 50 rpm (for about 0.2 seconds)→about 75 rpm (for about 0.2 seconds)→about 100 rpm (for about 2.0 seconds)→about 1000 rpm). When the rotation speed of the substrate W reaches the first dry speed, the rotation speed of the substrate W is maintained at the first dry speed.

In the first spin dry step T5, while the rotation speed of the substrate W is being increased from the paddle speed to the first dry speed, the scattering of the organic solvent from the upper surface of the substrate W to the surroundings is started. In other words, the spin dry step (S5) in which the organic solvent is scattered is started from the first spin dry step T5.

After the rotation speed of the substrate W reaches the first dry speed, the controller 3 controls the nozzle movement unit 99 to lower the gas nozzle 100 from the upper position to the close position closer to the substrate W as compared with the upper position. It takes, for example, about 2.0 seconds to lower the gas nozzle 100.

In the first spin dry step T5, the supply of the heating liquid to the lower surface of the substrate W is continued following the post-heating step T4. Hence, at the same time when the heating liquid is supplied to the lower surface of the substrate W, the spin dry step (S5) is performed.

When the gas nozzle 100 is located in the close position, the first spin dry step T5 is completed. When the first spin dry step T5 is completed, the controller 3 closes the heating liquid valve 58 to stop the supply of the heating liquid to the lower surface of the substrate W.

In other words, in all the period of the replacement step (S4) (that is, all the period of the first liquid film formation step T1, the droplet supply step T2, the second liquid film formation step T3 and the post-heating step T4), the supply of the heating liquid to the lower surface (rear surface) of the substrate W is continued.

Even in the early step (that is, the first spin dry step T5) of the spin dry step (S5), the heating liquid is supplied to the lower surface (rear surface) of the substrate W.

The post-heating step T4 and the first spin dry step T5 are continuously performed.

Thereafter, following the first spin dry step T5, the second spin dry step T6 is started. The controller 3 controls the spin motor 16 to accelerate the rotation of the substrate W to the predetermined first dry speed (for example, about 1000 rpm). The controller 3 opens the second gas valve 102 to discharge the nitrogen gas from three gas discharge ports (the upper-side gas discharge port 105, the lower-side gas discharge port 106 and the center gas discharge port 107). Here, the flow rates of nitrogen gas discharged from the upper-side gas discharge port 105, the lower-side gas discharge port 106 and the center gas discharge port 107 are, for example, 100 (liters/minute), 100 (liters/minute) and 50 (liters/minute), respectively. In this way, the ring-shaped gas current of three layers overlapping each other in an up/down direction is formed above the substrate W, and the ring-shaped gas current of three layers protects the upper surface of the substrate W. Since the upper surface can be dried while the atmosphere around the upper surface (front surface) of the substrate W is maintained to be the atmosphere of nitrogen, it is possible to reduce or prevent water mark generation on the upper surface of the substrate W after the drying.

When a predetermined period (for example, about 10 seconds) has elapsed since the start of the second spin dry step T6, the controller 3 controls the spin motor 16 to increase the rotation speed of the substrate W to a predetermined second dry speed (for example, about 2500 rpm). In this way, the organic solvent on the substrate W is further shaken off, and thus the substrate W is dried.

When a predetermined period of time (for example, about 10 seconds) has elapsed since the acceleration of the rotation speed of the substrate W to the predetermined second dry speed, the controller 3 controls the spin motor 16 to stop the rotation of the spin chuck 5. The controller 3 stops the rotation of the substrate W with the spin chuck 5, then closes the second gas valve 102 to stop the discharge of the gas from the three gas discharge ports 105, 106 and 107 and controls the nozzle movement unit 99 to retract the gas nozzle 100 to the home position. Thereafter, the substrate W is transported out from the processing chamber 4.

As described above, in the preferred embodiment, in the organic solvent supply steps T1 to T3 (the first liquid film formation step T1, the droplet supply step T2 and, the second liquid film formation step T3), the liquid film 160 of the organic solvent is formed on the upper surface (front surface) of the substrate W. In the post-heating step T4, in a state in which the supply to the upper surface (front surface) of the substrate W is stopped, the heating fluid is supplied to the lower surface (rear surface) of the substrate W. The supply of the heating fluid to the lower surface (rear surface) of the substrate W is performed at the same time of the first spin dry step T5. The supply of the heating fluid is stopped at the same time of the second spin dry step T6.

As described above, in the present preferred embodiment, in the post-heating step T4, even after the supply of the organic solvent to the upper surface (front surface) of the substrate W is stopped, the supply of the heating liquid to the lower surface (rear surface) of the substrate W is continued. In this way, at the start of the first spin dry step T5, the temperature of the organic solvent contained in the liquid film 160 of the organic solvent can be maintained to be high. Consequently, it is possible to complete the spin dry step (S5, the first spin dry step T5 and the second spin dry step T6) in a short period of time. If the spin dry step (S5) can be completed in a short period of time, it is possible to restrict the impulse of the surface tension acting on the pattern at a small level. Furthermore, the heating liquid is supplied to the lower surface (rear surface) of the substrate W at the same time of part of the period (the first spin dry step T5) of the spin dry step (S5), and thus it is possible to further reduce the time necessary for the spin dry step (S5). If the spin dry step can be completed in a short period of time, it is possible to restrict the impulse of the surface tension acting on the pattern at a small level. In this way, it is possible to more effectively reduce the collapse of the pattern at the time of the spin dry step (S5, the first spin dry step T5 and the second spin dry step T6).

In the post-heating step T4, at the same time when the heating liquid is supplied to the lower surface (rear surface) of the substrate W, the first and second organic solvent nozzles 31 and 32 are retracted from above the substrate W, and the gas nozzle 100 is located above the substrate W. Since even in the period of the retraction and the arrangement, the supply of the heating liquid to the rear surface of the substrate W is continued, it is possible to heat the liquid film 160 of the organic solvent until immediately before the start of the second spin dry step T6.

Following the supply of the heating liquid to the lower surface (rear surface) of the substrate W in the second liquid film formation step T3, in the post-heating step T4, the heating liquid is supplied to the lower surface (rear surface) of the substrate W. In the post-heating step T4, the heating liquid is supplied to the lower surface (rear surface) of the substrate W while the supply of the organic solvent to the upper surface (front surface) of the substrate W is stopped, and thus in this case, the temperature of the liquid film 160 of the organic solvent can be further increased as compared with the temperature at the time of the organic solvent supply steps T1 to T3. In this way, the temperature of the liquid film 160 of the organic solvent at the start of the spin dry step (S5) can be maintained at a much higher temperature.

Although the preferred embodiment of the invention is described above, the present invention can be practiced with other preferred embodiments. For example, although the preferred embodiment discussed above is described using, as an example, the case where the first and second organic solvent nozzles 31 and 32 are supported with the common nozzle arm 35, the first and second organic solvent nozzles 31 and 32 may be individually supported with separate nozzle arms.

Although in the description of the preferred embodiment discussed above, in the droplet supply step T2, the discharge region (see FIG. 15B) is reciprocated between one circumferential edge portion of the upper surface of the substrate W and the center portion of the upper surface of the substrate W (half-scan), the discharge region may be moved between the one circumferential edge portion of the upper surface of the substrate W and the other circumferential edge portion on the opposite side through the one circumferential edge portion and the center portion of the upper surface of the substrate W (full-scan).

In the droplet supply step T2, the discharge region (see FIG. 15B) may be in a stationary state without being scanned. In this case, in order to enhance the performance of the replacement with the organic solvent in the circumferential edge portion of the upper surface of the substrate W, it is preferable to locate the discharge region (see FIG. 15B) in the circumferential edge portion of the upper surface of the substrate W.

Although in the description of the preferred embodiment discussed above, the replacement step (S4) includes the organic solvent supply steps T1 to T3, at least one of them is preferably included.

Although in the description of the preferred embodiment discussed above, in the first and second liquid film formation steps T1 and T3, the continuous flow of the organic solvent is discharged from the second organic solvent nozzle 32, in the first and second liquid film formation steps T1 and T3, by opening the first organic solvent valve 39 while closing the first gas valve 41, the continuous flow of the organic solvent may be discharged from the first organic solvent nozzle 31. In this case, it is possible to omit the configuration of the first organic solvent nozzle 31, with the result that it is possible to reduce the cost.

Although the description is given using, as an example, the first organic solvent nozzle 31 which is an external mixing-type two-fluid nozzle that makes the gas and the liquid collide with each other outside the nozzle body (the outer cylinder 46 (see FIG. 5)) and mixes them to produce the droplets, it is also possible to adopt an internal mixing-type two-fluid nozzle which mixes the gas and the liquid within the nozzle body to produce the droplets.

Although the description is given using, as an example, the case where the paddle speed is so low as to be 10 rpm, the paddle speed which is the rotation speed of the substrate W may be so low as to be equal to or less than 50 rpm or zero.

Although in the above description, the post-heating step T4 and the spin dry step (the first spin dry step T5) are continuously performed, another step may be interposed between these steps. Although in the above description, the gas nozzle 100 has the three gas discharge ports 105, 106 and 107, the gas nozzle 100 does not need to have all of the three gas discharge ports 105, 106 and 107 as long as the gas nozzle 100 has at least one gas discharge port.

As the opposite member, instead of the gas nozzle 100, a blocking member may be provided which has a substrate opposite surface whose diameter is equal to or more than the diameter of the substrate W. In the spin dry step, the blocking member is arranged such that the substrate opposite surface is close to the upper surface of the substrate W, and thus a space above the upper surface of the substrate W is blocked from the surroundings thereof. In the substrate opposite surface, a nitrogen gas discharge port is formed which is opposite to the center portion of the upper surface of the substrate W and which discharges the nitrogen gas, and in the spin dry step, the nitrogen gas is discharged from the nitrogen gas discharge port, and thus the atmosphere around the front surface of the substrate W is maintained to be the atmosphere of nitrogen.

The opposite member may be omitted.

Although in the above description, the lower surface nozzle 60 includes only one nozzle portion 63, the lower surface nozzle 60 may include two or more nozzle portions 63. Although in the above description, the lower surface nozzle 60 is a bar nozzle which includes the nozzle portion 63, the lower surface nozzle may have a configuration (for example, a center shaft nozzle) in which no nozzle portion 63 is included.

Although in the preferred embodiment discussed above, the case where the warm water which is an example of the heating liquid is supplied to the lower surface of the substrate W is described, instead of the heating liquid, a heating gas may be supplied to the lower surface of the substrate W.

In the preferred embodiment discussed above, in the early step (the first spin dry step T5) of the spin dry step (S5), the heating fluid is supplied to the lower surface of the substrate W, and in the later step (the second spin dry step T6) of the spin dry step (S5), the supply of the heating fluid is stopped. However, throughout the entire spin dry step (S5), the heating fluid may be supplied to the lower surface of the substrate W.

The organic solvent (the low surface tension liquid whose surface tension is lower than that of the rinse liquid and whose boiling point is lower than that of the rinse liquid) used in the present invention is not limited to IPA. The organic solvent includes at least one of IPA, methanol, ethanol, HFE (hydro-fluoro-ether), acetone and trans-1,2-dichloroethylene. As the organic solvent, not only a solvent formed of a single component alone but also a liquid obtained by being mixed with another component may be used. For example, a mixture of IPA and acetone may be used or a mixture of IPA and methanol may be used.

Although in the preferred embodiment discussed above, the case where the substrate processing apparatus 1 is a device which processes a disc-shaped substrate is described, the substrate processing apparatus 1 may be a device which processes a polygonal substrate such as a liquid crystal display device glass substrate.

Although the preferred embodiments of the present invention are described in detail above, they are simply specific examples that are used so as to clarify the technical details of the present invention, the present invention should not be interpreted by being limited to these specific examples and the scope of the present invention is limited only by the scope of claims attached.

This application corresponds to Japanese Patent Application No. 2015-121150 filed with Japan Patent Office on Jun. 16, 2015, and the entire disclosure of this application is incorporated herein by reference.

What is claimed is:

1. A substrate processing method comprising:
    a replacement step of replacing a rinse liquid adhered to a front surface of a substrate with a low surface tension liquid whose surface tension is lower than a surface tension of the rinse liquid; and
    a spin dry step of rotating, after completion of the replacement step, the substrate about a predetermined rotation axis to spin off the low surface tension liquid so as to dry the front surface, wherein the replacement step includes:

a low surface tension liquid supply step of supplying the low surface tension liquid to the front surface while supplying a heating fluid to a rear surface on a side opposite to the front surface; and a post-heating step of supplying the heating fluid to the rear surface on the side opposite to the front surface of the substrate, in a state in which the supply of the low surface tension liquid to the front surface is stopped, before start of the spin dry step after completion of the low surface tension liquid supply step, wherein the low surface tension liquid supply step includes a step of discharging the low surface tension liquid from a low surface tension liquid nozzle which is located above the front surface of the substrate, the spin dry step is performed in a state in which an opposite member is opposite above the front surface of the substrate and in parallel with the post-heating step, the low surface tension liquid nozzle is retracted from above the substrate, and the opposite member is located above the substrate.

2. A substrate processing method comprising:

a replacement step of replacing a rinse liquid adhered to a front surface of a substrate with a low surface tension liquid whose surface tension is lower than a surface tension of the rinse liquid; and a spin dry step of rotating, after completion of the replacement step, the substrate about a predetermined rotation axis to spin off the low surface tension liquid so as to dry the front surface, wherein the replacement step includes:

a low surface tension liquid supply step of supplying the low surface tension liquid to the front surface while supplying a heating fluid to a rear surface on a side opposite to the front surface; and a post-heating step of supplying the heating fluid to the rear surface on the side opposite to the front surface of the substrate, in a state in which the supply of the low surface tension liquid to the front surface is stopped, before start of the spin dry step after completion of the low surface tension liquid supply step, wherein the low surface tension liquid supply step includes a droplet supply step of supplying a droplet of an organic solvent produced by mixing the organic solvent with a gas to at least an outer circumferential portion of the front surface, wherein the droplet supply step includes:

a droplet discharge step of discharging the droplet of the organic solvent from a two-fluid nozzle to a discharge region within the front surface; and a discharge region movement step of moving the discharge region between a center portion of the front surface and a circumferential edge portion of the front surface in parallel with the droplet discharge step.

3. The substrate processing method according to claim 2, wherein the low surface tension liquid supply step includes a first liquid film formation step which is performed before the droplet supply step and which supplies the organic solvent to the front surface so as to form a liquid film of the organic solvent covering the entire front surface.

4. The substrate processing method according to claim 3, wherein the low surface tension liquid supply step includes a second liquid film formation step which is performed after the droplet supply step and which supplies the organic solvent to the front surface so as to form a liquid film of the organic solvent covering the entire front surface.

* * * * *